US006803651B1

(12) United States Patent
Chiang

(10) Patent No.: US 6,803,651 B1
(45) Date of Patent: Oct. 12, 2004

(54) OPTOELECTRONIC SEMICONDUCTOR PACKAGE DEVICE

(75) Inventor: Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 10/082,500

(22) Filed: Feb. 25, 2002

Related U.S. Application Data

(63) Continuation-in-part of application No. 10/042,812, filed on Jan. 9, 2002.

(51) Int. Cl.[7] .............................................. H01L 23/04
(52) U.S. Cl. ...................... 257/698; 257/666; 257/676; 257/680; 257/431; 257/432; 438/100; 438/106; 438/123
(58) Field of Search .............................. 257/724, 725, 257/698, 680, 704, 710, 431–434, 666, 676, 696, 672; 438/100, 106, 123

(56) References Cited

U.S. PATENT DOCUMENTS

| | | | |
|---|---|---|---|
| 3,627,901 A | 12/1971 | Happ ...................... 174/52 PE |
| 3,678,385 A | 7/1972 | Bruner ................... 324/158 F |
| 3,930,114 A | 12/1975 | Hodge .................... 174/52 FP |
| 4,506,238 A | 3/1985 | Endoh et al. ............... 333/138 |
| 4,971,930 A | * 11/1990 | Fusaroli et al. ............. 438/116 |
| 5,081,520 A | 1/1992 | Yoshii et al. .................. 357/80 |
| 5,149,958 A | * 9/1992 | Hallenbeck et al. ......... 250/216 |
| 5,157,480 A | 10/1992 | McShane et al. ............. 357/74 |
| 5,207,102 A | 5/1993 | Takahashi et al. ............ 73/727 |
| 5,241,133 A | 8/1993 | Mullen, III et al. ....... 174/52.4 |
| 5,264,714 A | * 11/1993 | Nakaya et al. ................ 257/78 |
| 5,394,303 A | 2/1995 | Yamaji ....................... 361/749 |
| 5,405,809 A | * 4/1995 | Nakamura et al. ............ 438/64 |
| 5,436,500 A | 7/1995 | Park et al. .................. 257/696 |
| 5,440,231 A | 8/1995 | Sugai ..................... 324/158.1 |
| 5,523,608 A | 6/1996 | Kitaoka et al. ............. 257/433 |
| 5,530,282 A | * 6/1996 | Tsuji .......................... 257/666 |
| 5,665,652 A | 9/1997 | Shimizu ..................... 438/127 |
| 5,674,785 A | 10/1997 | Akram et al. ............... 437/217 |
| 5,677,566 A | 10/1997 | King et al. ................. 257/666 |
| 5,744,827 A | 4/1998 | Jeong et al. ................ 257/686 |
| 5,744,859 A | 4/1998 | Ouchida ..................... 257/668 |

(List continued on next page.)

FOREIGN PATENT DOCUMENTS

| | | | | |
|---|---|---|---|---|
| JP | 57100761 A | * | 6/1982 | |
| JP | 01128897 | | 5/1989 | .......... B42D/15/02 |
| JP | 06-097352 A | * | 4/1994 | |
| JP | 06097352 | | 4/1994 | .......... H01L/23/50 |

OTHER PUBLICATIONS

Image Sensor Data Sheet, Amkor Technology, DS579, Apr. 2001, pp. 1–2.
Crowley, "Socket Developments for CSP and FBGA Packages," Chip Scale Review, May 1998, pp. 37–40.
Forster, "Socket Challenges for Chip–Scale Packages," Chip Scale Review, May 1998, pp. 43–47.

(List continued on next page.)

*Primary Examiner*—Bradley Baumeister
*Assistant Examiner*—Chris C. Chu
(74) *Attorney, Agent, or Firm*—David M. Sigmond

(57) ABSTRACT

An optoelectronic semiconductor package device includes a semiconductor chip, an insulative housing and a conductive trace, wherein the chip includes an upper surface and a lower surface, the upper surface includes a light sensitive cell and a conductive pad, the insulative housing includes a first single-piece non-transparent insulative housing portion that contacts the lower surface and is spaced from the light sensitive cell and a second transparent insulative housing portion that contacts the first housing portion and the light sensitive cell, and the conductive trace extends outside the insulative housing and is electrically connected to the pad inside the insulative housing.

154 Claims, 25 Drawing Sheets

U.S. PATENT DOCUMENTS

| | | | |
|---|---|---|---|
| 5,804,771 A | | 9/1998 | McMahon et al. .......... 174/255 |
| 5,811,799 A | | 9/1998 | Wu ............................ 250/239 |
| 5,811,879 A | | 9/1998 | Akram ........................ 257/720 |
| 5,834,835 A | * | 11/1998 | Maekawa ................... 257/680 |
| 5,834,843 A | * | 11/1998 | Mori et al. ................. 257/723 |
| 5,859,471 A | * | 1/1999 | Kuraishi et al. ............ 257/666 |
| 5,866,939 A | | 2/1999 | Shin et al. .................. 257/666 |
| 5,893,723 A | * | 4/1999 | Yamanaka ................... 438/65 |
| 5,894,107 A | | 4/1999 | Lee et al. .................. 174/52.2 |
| 5,949,655 A | | 9/1999 | Glenn ........................ 361/783 |
| 5,951,804 A | | 9/1999 | Kweon et al. ......... 156/244.12 |
| 5,998,878 A | | 12/1999 | Johnson ...................... 257/797 |
| 6,001,671 A | * | 12/1999 | Fjelstad ...................... 438/112 |
| 6,013,877 A | | 1/2000 | Degani et al. .............. 174/254 |
| 6,025,650 A | * | 2/2000 | Tsuji et al. ................. 257/786 |
| 6,034,424 A | | 3/2000 | Fujimura et al. ........... 257/696 |
| 6,114,770 A | | 9/2000 | Akram et al. ............... 257/784 |
| 6,130,116 A | | 10/2000 | Smith et al. ................ 438/127 |
| 6,143,588 A | | 11/2000 | Glenn ........................ 438/116 |
| 6,159,770 A | | 12/2000 | Tetaka et al. ............... 438/112 |
| 6,198,171 B1 | | 3/2001 | Huang et al. ............... 257/787 |
| 6,218,728 B1 | | 4/2001 | Kimura ...................... 257/693 |
| 6,232,152 B1 | | 5/2001 | DiStefano et al. .......... 438/124 |
| 6,252,252 B1 | | 6/2001 | Kunii et al. .................. 257/81 |
| 6,252,726 B1 | | 6/2001 | Verdiell ...................... 359/820 |
| 6,265,770 B1 | * | 7/2001 | Uchiyama ................... 257/698 |
| 6,274,927 B1 | * | 8/2001 | Glenn ........................ 257/680 |
| 6,281,568 B1 | * | 8/2001 | Glenn et al. ................ 257/684 |
| 6,285,043 B1 | | 9/2001 | Yap ............................. 257/81 |
| 6,285,064 B1 | | 9/2001 | Foster ........................ 257/433 |
| 6,297,543 B1 | | 10/2001 | Hong et al. ................. 257/666 |
| 6,303,997 B1 | | 10/2001 | Lee ............................ 257/778 |
| 6,326,700 B1 | | 12/2001 | Bai et al. .................... 257/790 |
| 6,353,265 B1 | | 3/2002 | Michii ........................ 257/777 |
| 6,369,595 B1 | | 4/2002 | Farnworth et al. .......... 324/755 |
| 6,445,077 B1 | | 9/2002 | Choi et al. .................. 257/786 |
| 6,455,356 B1 | | 9/2002 | Glenn et al. ................ 438/123 |
| 6,468,836 B1 | | 10/2002 | Distefano et al. ........... 438/128 |
| 6,512,219 B1 | * | 1/2003 | Webster et al. .......... 250/208.1 |

OTHER PUBLICATIONS

Amagai, "Chip–Scale Packages for Center–Pad Memory Devices," Chip Scale Review, May 1998, pp. 68–77.

Vandevelde et al., "The PSGA, a Lead–Free CSP for High Performance & High Reliable Packaging," Proceedings of the 2001 International Symposium on Microelectronics, Oct. 9, 2001, pp. 260–265.

U.S. application Ser. No. 09/865,367, filed May 24, 2001, entitled "Semiconductor Chip Assembly With Simultaneously Electroplated Contact Terminal and Connection Joint".

U.S. application Ser. No. 09/864,555, filed May 24, 2001, entitled "Semiconductor Chip Assembly with Simultaneously Electrolessly Plated Contact Terminal and Connection Joint".

U.S. application Ser. No. 09/864,773, filed May 24, 2001, entitled "Semiconductor Chip Assembly With Ball Bond Connection Joint".

U.S. application Ser. No. 09/878,649 filed Jun. 11, 2001, entitled "Method of Making a Semiconductor Chip Assembly with a Conductive Trace Subtractively Formed Before and After Chip Attachment".

U.S. application Ser. No. 09/878,626 filed Jun. 11, 2001, entitled "Method of Connecting a Conductive Trace to a Semiconductor Chip".

U.S. application Ser. No. 09/917,339 filed Jul. 27, 2001, entitled "Method of Connecting a Bumped Compliant Conductive Trace to a Semiconductor Chip".

U.S. application Ser. No. 09/927,216 filed Aug. 10, 2001, entitled "Semiconductor Chip Assembly with Hardened Connection Joint".

U.S. application Ser. No. 09/939,140 filed Aug. 24, 2001, entitled "Semiconductor Chip Assembly with Interlocked Conductive Trace".

U.S. application Ser. No. 09/962,754 filed Sep. 24, 2001, entitled "Method of Connecting a Conductive Trace and an Insulative Base to a Semiconductor Chip".

U.S. application Ser. No. 09/972,796 filed Oct. 6, 2001, entitled "Method of Connecting a Bumped Compliant Conductive Trace and an Insulative Base to a Semiconductor Chip".

U.S. application Ser. No. 09/997,973 filed Nov. 29, 2001, entitled "Method of Connecting a Bumped Conductive Trace to a Semiconductor Chip".

* cited by examiner

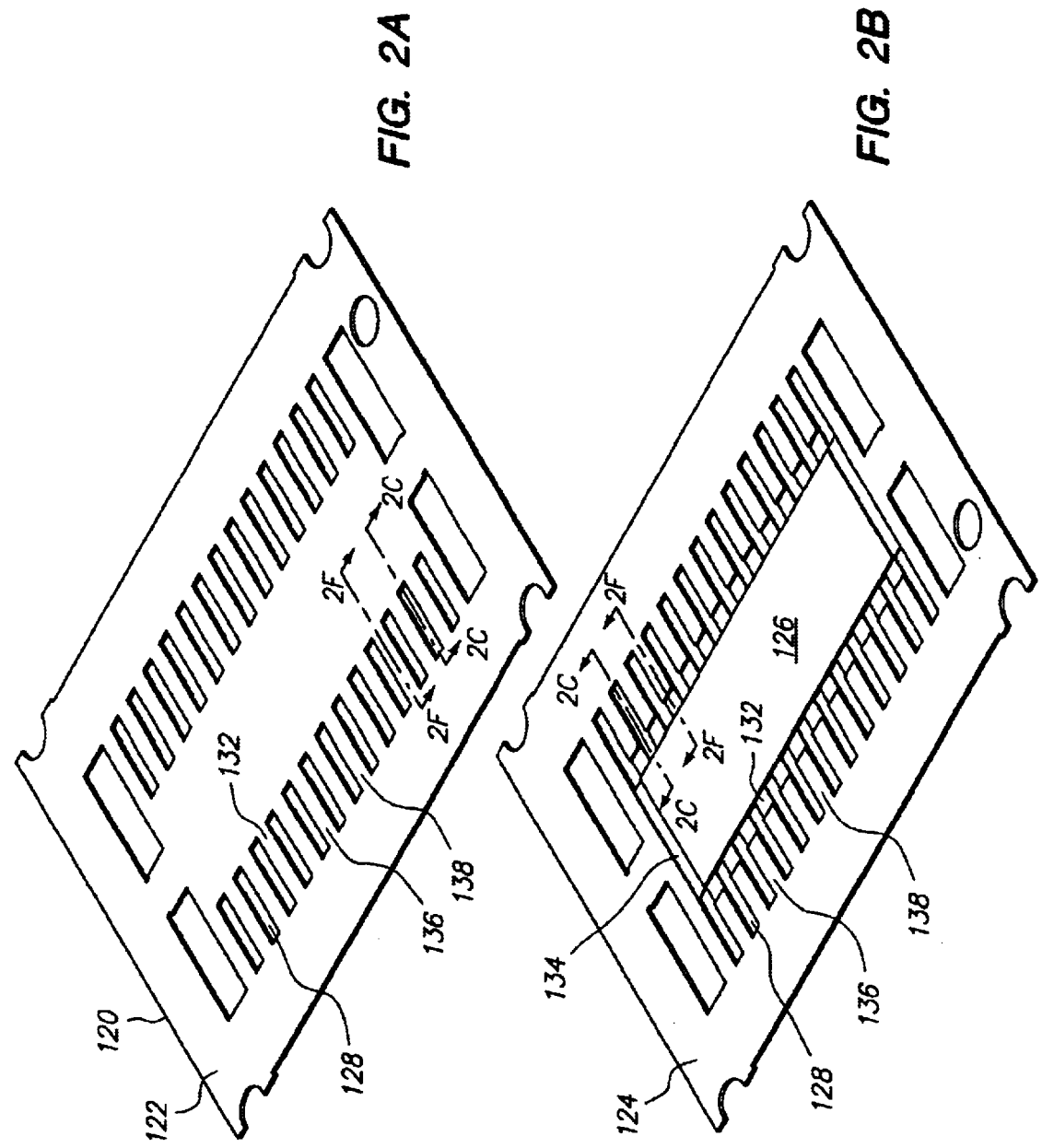

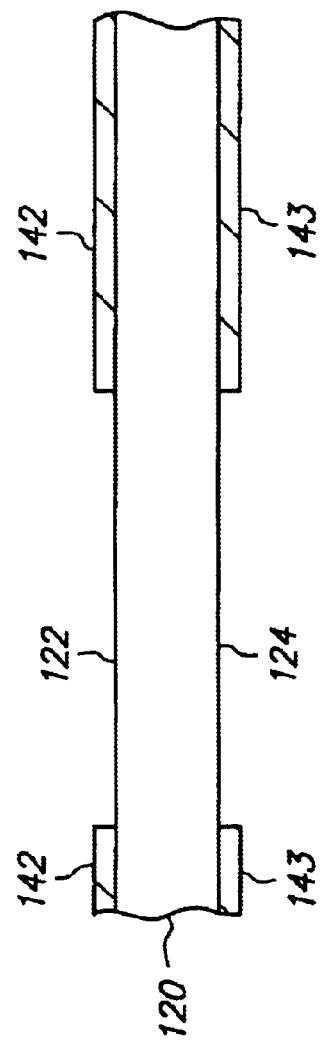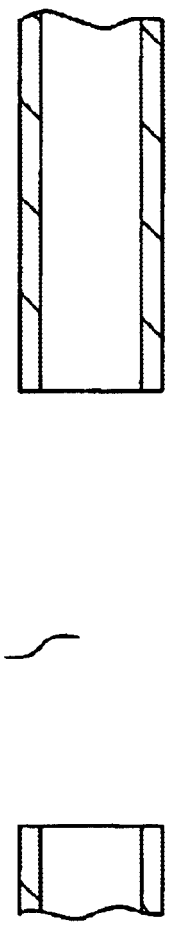
FIG. 2C
FIG. 2D
FIG. 2E

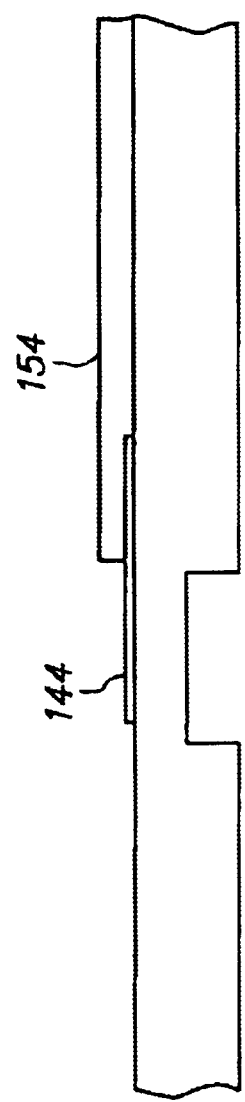

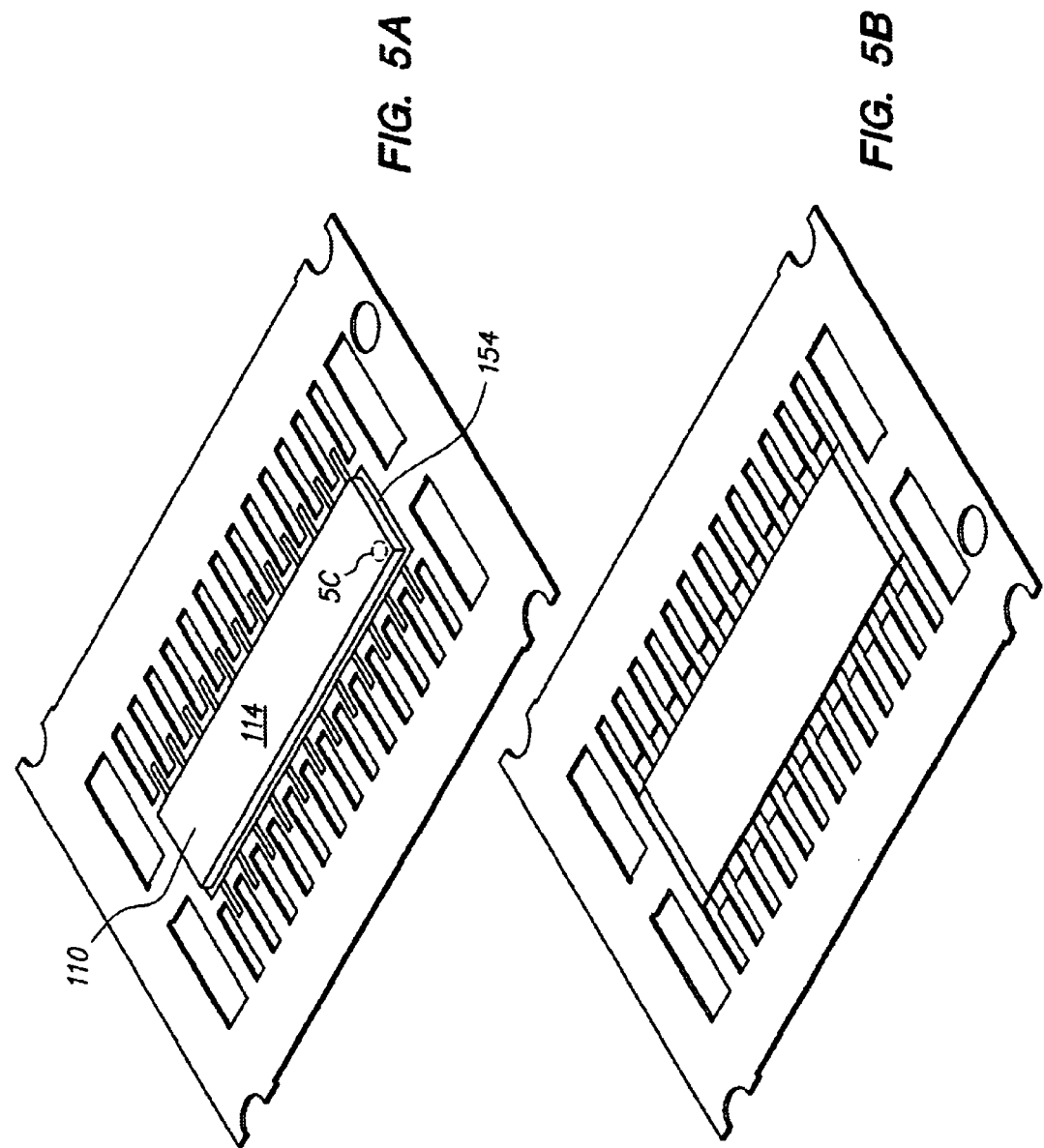

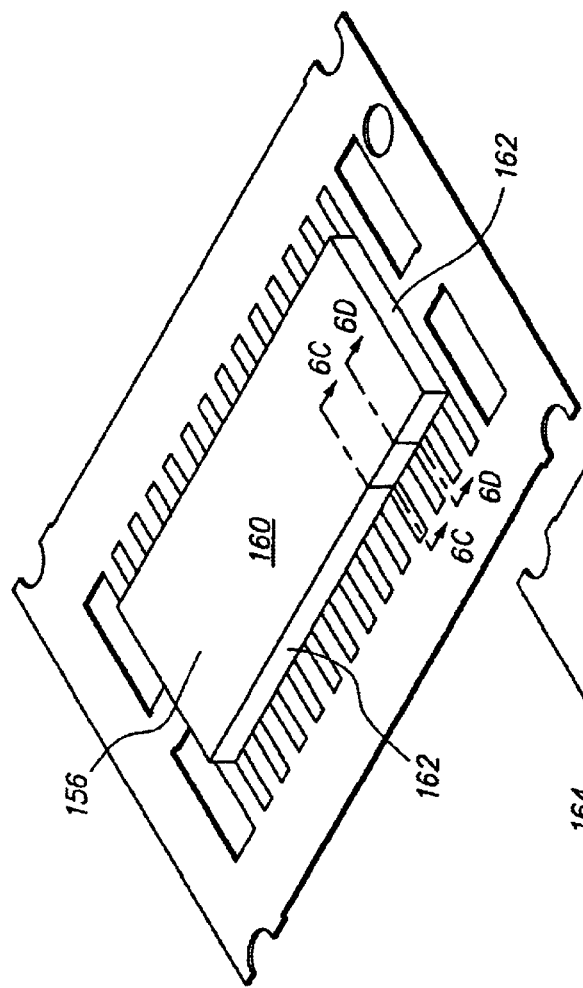
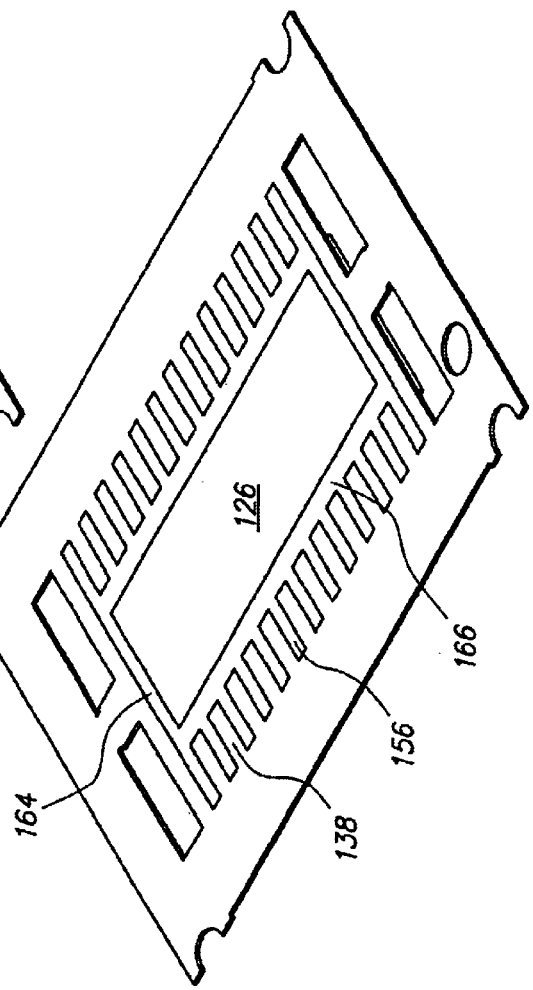
FIG. 6A
FIG. 6B

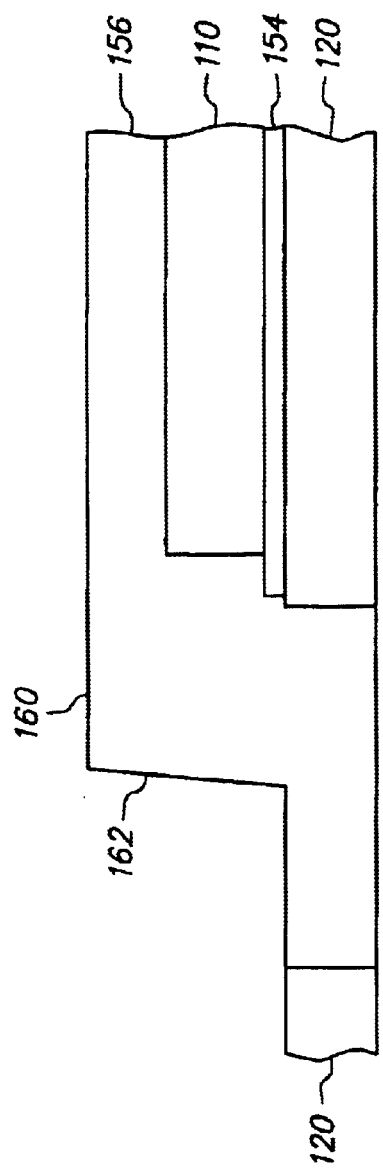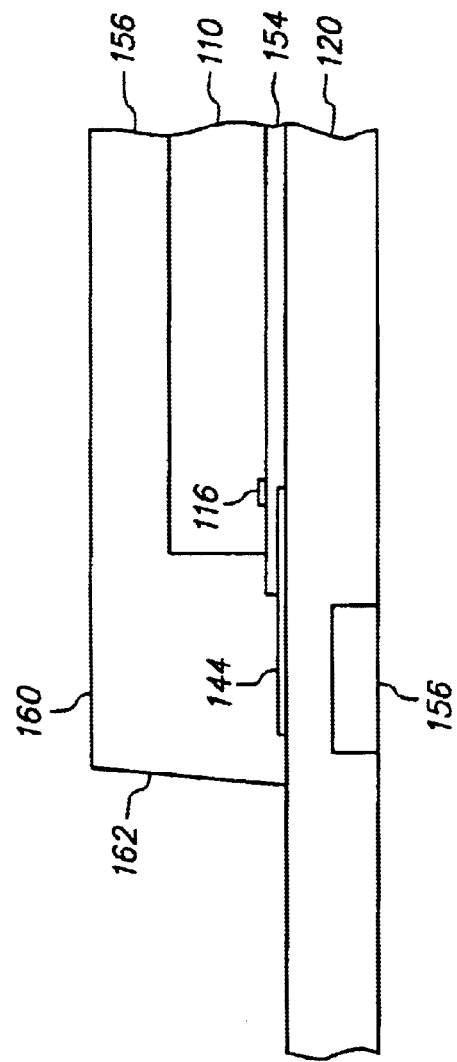

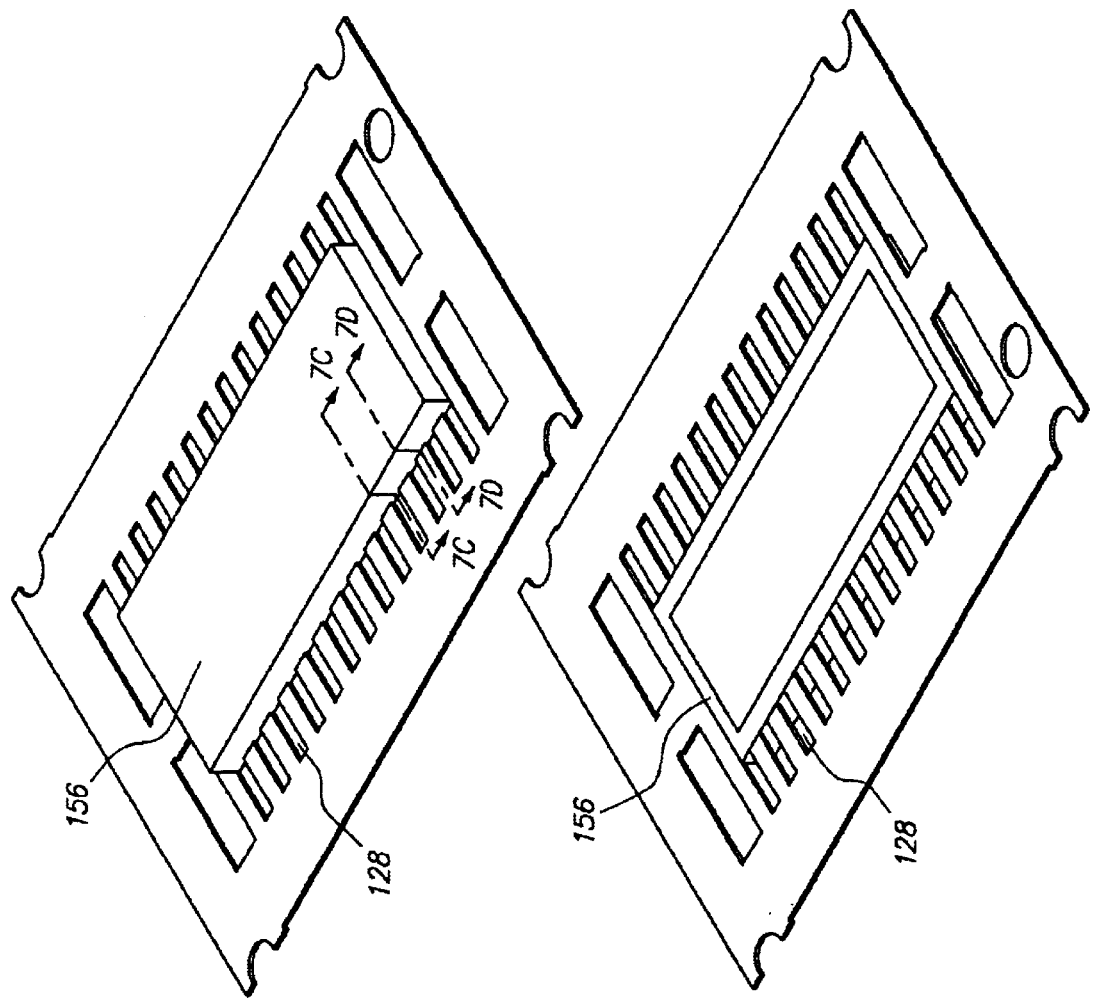

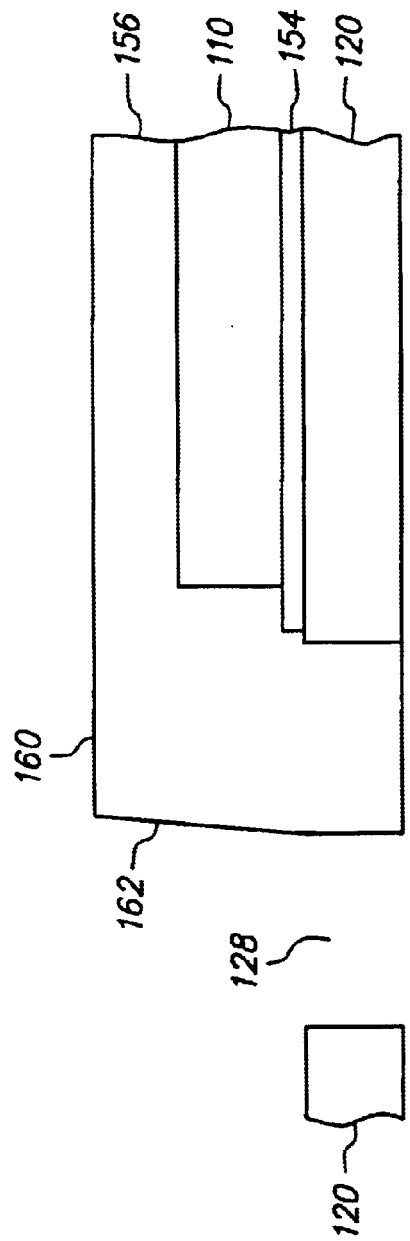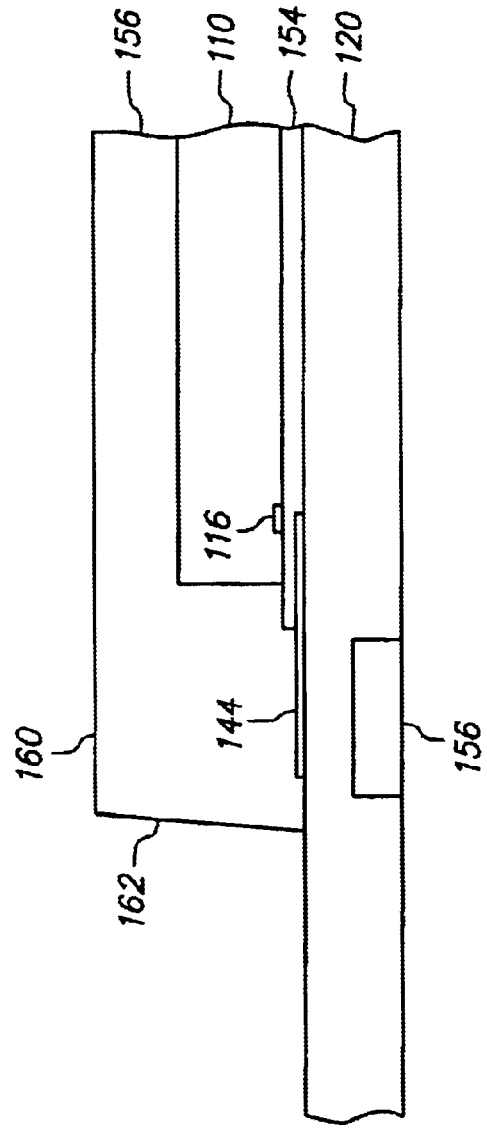

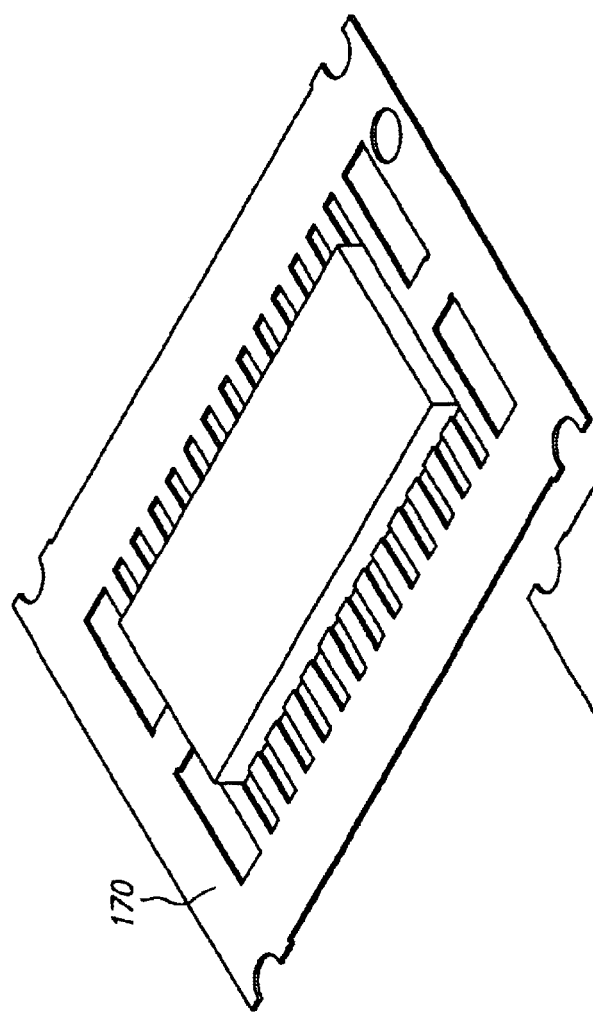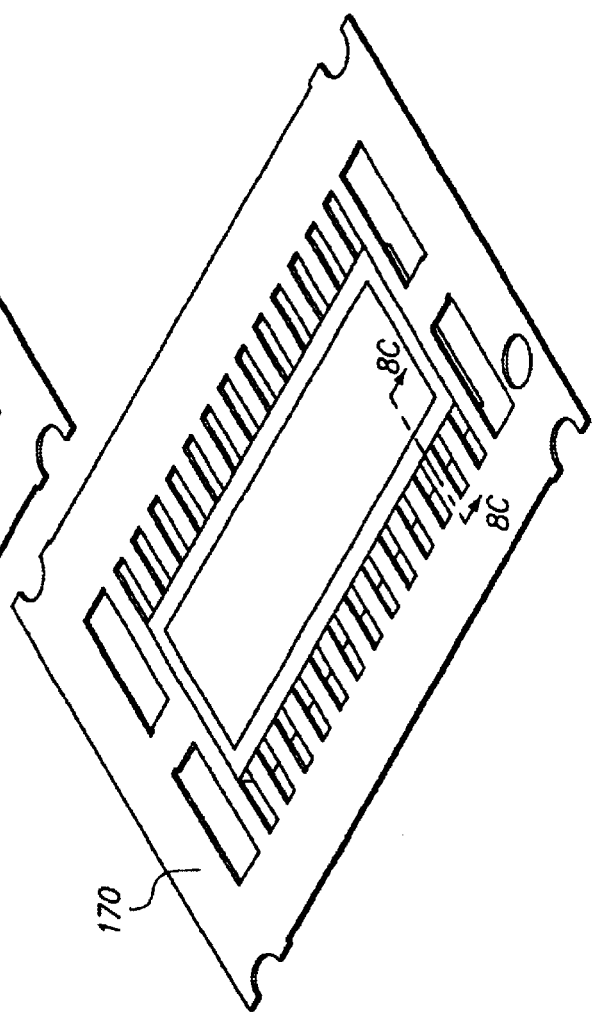

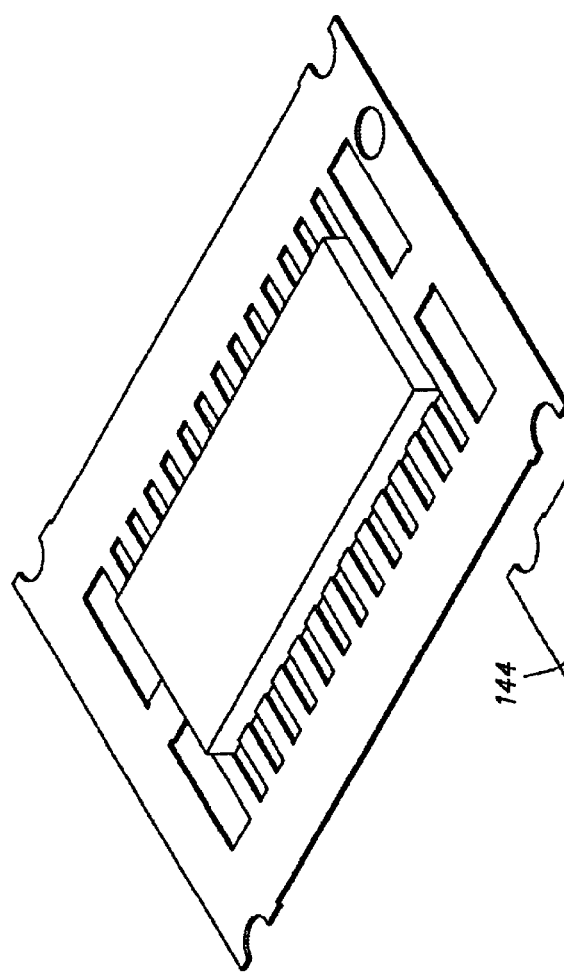
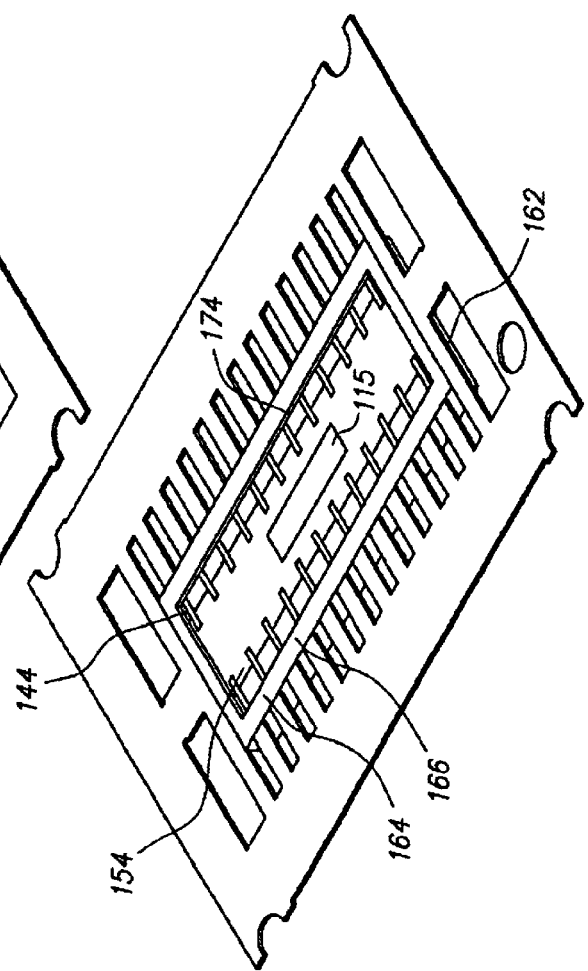
FIG. 9A
FIG. 9B

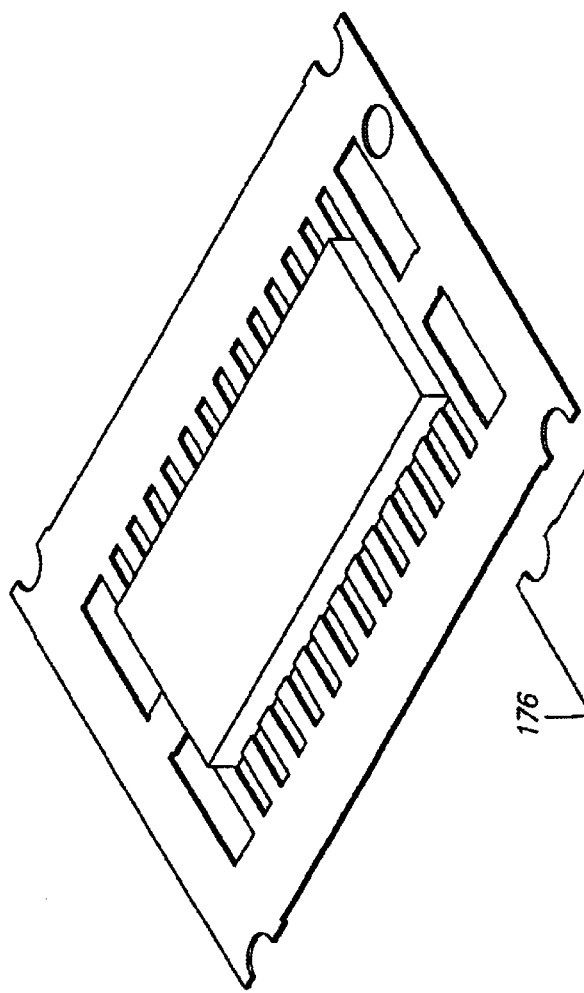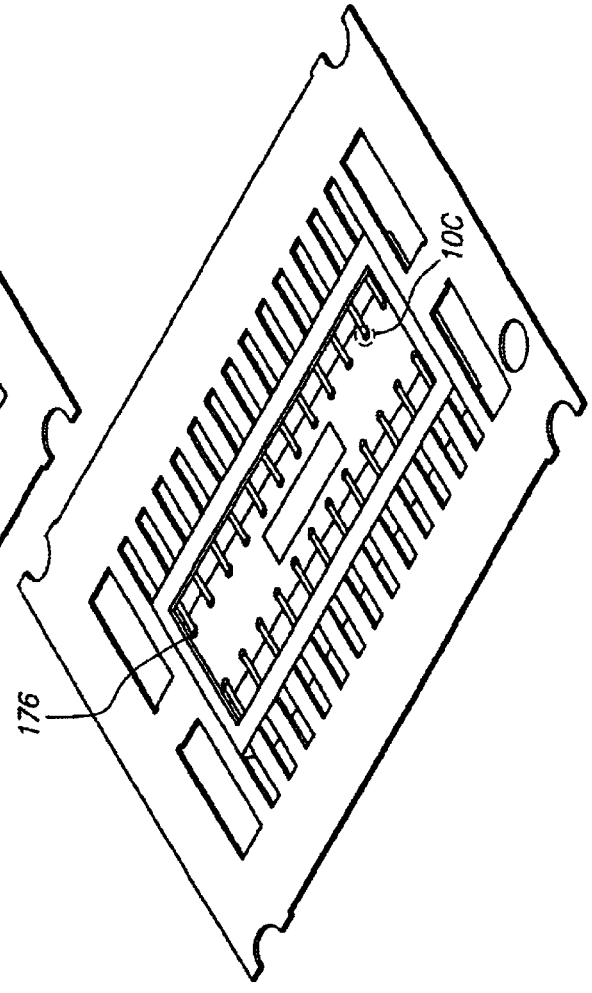

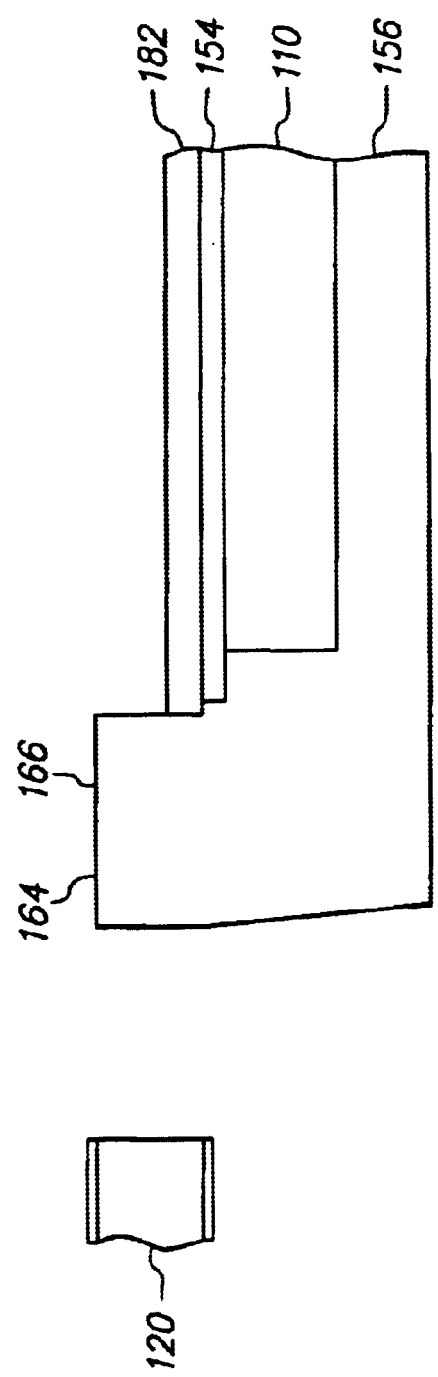

OPTOELECTRONIC SEMICONDUCTOR PACKAGE DEVICE

CROSS-REFERENCE TO RELATED APPLICATIONS

This application is a continuation-in-part of U.S. application Ser. No. 10/042,812 filed Jan. 9, 2002, which is incorporated by reference.

BACKGROUND OF THE INVENTION

1. Field of the Invention

The present invention relates to semiconductor packaging, and more particularly to optoelectronic semiconductor package devices.

2. Description of the Related Art

In the field of electronic systems, there is a continuous need to increase performance and reduce size. This is largely achieved by improving semiconductor wafer manufacturing and semiconductor packaging technologies. Wafer manufacturing involves simultaneously fabricating numerous semiconductor chips as a batch on a silicon wafer using various etching, doping and depositing steps. After the wafer is complete, the chips are separated from one another and packaged.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Semiconductor chips have input/output pads that must be connected to external circuitry in order to function as part of an electronic system. Traditionally, a single chip is individually housed in a single-chip package that is connected to other single-chip packages through a printed circuit board (or motherboard) which supplies power to the chips and provides signal routing among the chips. The single-chip package has connection media that is typically an array of metallic leads (e.g., a lead frame) or a support circuit (e.g., a substrate).

Several connection techniques are widely used for connecting the chip pads and the connection media. These include wire bonding, tape automated bonding (TAB) and flip-chip bonding. Wire bonding is by far the most common. In this approach, wires are bonded, one at a time, from the chip to external circuitry by thermocompression, thermosonic or ultrasonic processes. TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface. Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Many variations exist on these basic methods.

A major advantage of flip-chip bonding over wiring bonding and TAB is that it provides shorter connection paths between the chip and the external circuitry, and therefore has better electrical characteristics such as less inductive noise, crosstalk, propagation delay and waveform distortion. In addition, flip-hip bonding requires minimal mounting area and weight which results in overall cost saving since no extra packaging and less circuit board space are used. While flip-chip technology has tremendous advantages over wire bonding and TAB, its cost and technical limitations are significant. For instance, the cost of forming bumps on the pads is significant. An adhesive is normally underfilled between the chip and the support circuit to reduce stress on the solder joints due to thermal mismatch between the chip and the support circuit, and the underfilling process increases both manufacturing complexity and cost. The solder joints exhibit increased electrical resistance as well as cracks and voids over time due to fatigue from thermomechanical stresses. Further, the solder is typically a tin-lead alloy and lead-based materials are becoming far less popular due to environmental concerns over disposing of toxic materials and leaching of toxic materials into ground water supplies. Thus, none of these conventional connection techniques are entirely satisfactory.

Optoelectronics pertains to the interaction of optical processes with electronic processes. This interaction is typically associated with energy conversion between optical signals and electrical signal& Optoelectronic devices such as lasers, photodetectors, optical modulators, optical switches and optical sensors are examples of devices within which this interaction takes place.

Optical sensors (also called optical detectors or image sensors) have proliferated in a variety of devices that are available both to high-end users, such as professional video studios and graphics art houses, and ordinary consumers as well. Such devices include video cameras, digital still cameras, desktop scanners, film scanners, machine vision equipment, bar-code readers, toys, and biometric tools such as retina, fingerprint, palm and facial recognition scanners that capture relatively high resolution monochrome or color images and convert them into analog or digital signals for storage, manipulation and/or distribution.

Optoelectronic packages for optical sensors often include a chip carrier, an optoelectronic chip mounted in a cavity of the chip carrier, and a transparent window positioned above the chip that hermetically seals the cavity and passes through the incident light to the chip. The optoelectronic chip typically includes a light sensitive cell that comprises an array of tiny photosensor elements, such as charge coupled devices (CCDs) or complimentary metal oxide semiconductor (CMOS) photoreceptors. The photosensor elements convert the light energy incident upon them into electrical signals on an element-by-element or pixel-by-pixel basis. These signals convey information about the intensity, color, hue, saturation and other attributes of the incident light.

Optoelectronic packages with optical windows provided by glass or quartz inserts are relatively expensive to fabricate. Moreover, optoelectronic packages often employ wire bonding, TAB or flip-chip bonding to connect the chip pads to the chip carrier, and as mentioned above, none of these chip pad connection techniques are entirely satisfactory.

In view of the various development stages and limitations in currently available optoelectronic semiconductor package devices, there is a need for an optoelectronic semiconductor package device that is cost-effective, reliable, manufacturable, and provides excellent mechanical and electrical performance.

SUMMARY OF THE INVENTION

An object of the present invention is to provide an optoelectronic semiconductor package device that provides a low cost, high performance, high reliability package.

In accordance with one aspect of the invention, an optoelectronic semiconductor package device includes a semiconductor chip, an insulative housing and a conductive trace, wherein the chip includes an upper surface and a lower surface, the upper surface includes a light sensitive cell and a conductive pad, the insulative housing includes a first single-piece non-transparent insulative housing portion that contacts the lower surface and is spaced from the light sensitive cell and a second transparent insulative housing portion that contacts the first housing portion and the light sensitive cell, and the conductive trace extends outside the insulative housing and is electrically connected to the pad inside the insulative housing.

Preferably, the first housing portion contacts the outer side surfaces of the chip and is spaced from the upper surface, and the second housing portion contacts the conductive trace and is spaced from the lower surface.

It is also preferred that the insulative housing includes top, bottom and peripheral side surfaces, the first housing portion provides the bottom surface, the peripheral side surfaces and a peripheral portion of the top surface, and the second housing portion provides a central portion of the top surface.

It is also preferred that the peripheral portion of the top surface is shaped as a rectangular peripheral ledge with inner side surfaces opposite the peripheral side surfaces and outside a periphery of the chip, and the second housing portion is located within and recessed relative to the peripheral ledge.

It is also preferred that the first housing portion is a transfer molded material, and the second housing portion is a cured polymeric material.

It is also preferred that the conductive trace protrudes laterally from and extends through a peripheral side surface of the first housing portion, and the conductive trace includes a recessed portion that extends through the peripheral side surface and is spaced from the top and bottom surfaces and a non-recessed portion that extends outside the insulative housing and is adjacent to the recessed portion and a corner between the side surface and the top surface.

It is also preferred that the device is devoid of wire bonds, TAB leads and solder joints.

In accordance with another aspect of the invention, a method of making an optoelectronic semiconductor package device includes attaching a conductive trace to a semiconductor chip using an insulative adhesive, wherein the chip includes a light sensitive cell and a conductive pad, forming a first single-piece insulative housing portion that contacts the chip and the conductive trace without contacting the light sensitive cell, forming a connection joint that contacts and electrically connects the conductive trace and the pad, and forming a second insulative housing portion that contacts the first housing portion and the light sensitive cell and is transparent.

An advantage of the optoelectronic semiconductor package device of the present invention is that it is reliable, cost-effective, easily manufacturable, and can be directly mounted on a printed circuit board. Another advantage is that the device need not include wire bonds, TAB leads or solder joints. Another advantage is that the first housing portion can surround and interlock the conductive traces. Another advantage is that the second housing portion can provide a compact, low cost optical window. Another advantage is that the device can be manufactured using low temperature processes which reduces stress and improves reliability. A further advantage is that the device can be manufactured using well-controlled processes which can be easily implemented by circuit board, lead frame and tape manufacturers. Still another advantage is that the device can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A–14A are bottom perspective views that show a method of making an optoelectronic semiconductor package device in accordance with an embodiment of the present invention;

FIGS. 1B–14B are top perspective views corresponding to FIGS. 1A–14A, respectively;

FIGS. 2C, 2D and 2E are enlarged cross-sectional views taken across line 2C—2C in FIGS. 2A and 2B that show the formation of a representative slot in greater detail;

FIG. 4C is an enlarged cross-sectional view taken across line 4C—4C in FIG. 4A that shows the liquid resin on a representative metal trace in greater detail;

FIG. 6C is an enlarged cross-sectional view taken across line 6C—6C in FIG. 6A that shows the encapsulant filling a representative slot in greater detail;

FIG. 6D is an enlarged cross-sectional view taken across line 6D—6D in FIG. 6A that shows the encapsulant filling a representative recessed portion in greater detail;

FIG. 7C is an enlarged cross-sectional view taken across line 7C—7C in FIG. 7A that shows the encapsulant removed from a portion of a representative slot in greater detail;

FIG. 7D is an enlarged cross-sectional view taken across line 7D—7D in FIG. 7A that shows the encapsulant intact in a representative recessed portion in greater detail;

FIG. 12C is an enlarged cross-sectional view taken across line 12C—12C in FIG. 12B that shows the transparent base in greater detail.

DETAILED DESCRIPTION OF THE PREFERRED EMBODIMENTS

FIGS. 1A–14A and 1B–14B are bottom and top perspective views, respectively, of a method of making an optoelectronic semiconductor package device in accordance with an embodiment of the present invention.

Figure 1A:
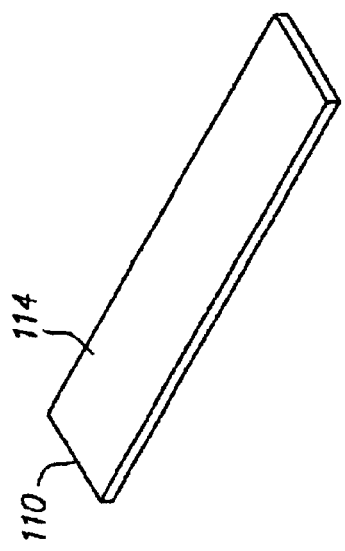
Figure 1B:
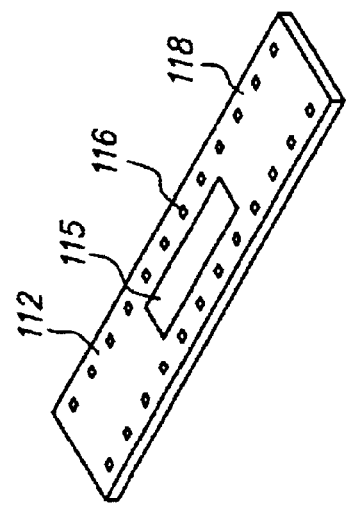

FIGS. 1A and 1B are bottom and top perspective views, respectively, of semiconductor chip 110 which is an integrated circuit in which various transistors, circuits, interconnect lines and the like are formed (not shown). Chip 110 is an optoelectronic image sensor that converts light into electronic signals. Chip 110 includes opposing major surfaces 112 and 114 and has a thickness of 200 microns between these surfaces. Surface 112 is an upper surface, and surface 114 is a lower surface. Surface 112 is the active surface and includes light sensitive cell 115, conductive pads 116 and passivation layer 118. Light sensitive cell 115 is located at a central portion of surface 112, and pads 116 are spaced from light sensitive cell 15 and located at a peripheral portion of surface 112 near the outer side surfaces (or edges) of chip 110 between surfaces 112 and 114. Light sensitive cell 115 and pads 116 are substantially aligned with passivation layer 118. Alternatively, if desired, light sensitive cell 115 and/or pads 116 can extend above or be recessed below passivation layer 118.

Light sensitive cell 115 is a vision cell designed to receive visible light from the external environment during normal operation of chip 110. Light sensitive cell 115 comprises an array of tiny photosensor elements (not shown) that convert the light energy incident upon them into electrical signals.

Pads 116 provide bonding sites to electrically couple chip 110 with external circuitry. Thus, a particular pad 116 can be input/output pad or a power/ground pad. Pads 116 have a length and width of 70 microns.

Pads 116 have aluminum bases that are cleaned by dipping chip 110 in a solution containing 0.05 M phosphoric acid at room temperature for 1 minute and then rinsed in distilled water. Thereafter, pads 116 are treated to provide surface layers that will accommodate subsequently formed connection joints. Pads 116 can be treated by depositing several metal layers, such as chromium/copper/gold or titanium/nickel/gold on the aluminum bases. The chromium or titanium layer provides a barrier for the aluminum base and an adhesive between the overlaying metal and the aluminum base. The metal layers, however, are typically selectively deposited by evaporation or electroplating using a mask which is a relatively complicated process. Alternatively, pads 116 can be treated by forming nickel surface layers on the aluminum bases. For instance, chip 110 is dipped in a zinc solution to deposit a zinc layer on the aluminum bases. This step is commonly known as zincation. Preferably, the zinc solution contains about 150 grams/liter of NaOH, 25 grams/liter of ZnO, and 1 gram/liter of NaNO$_3$, as well as tartaric acid to reduce the rate at which the aluminum bases dissolve. Thereafter, nickel surface layers are electrolessly deposited on the zincated aluminum bases. A suitable electroless nickel plating solution is Enthone Enplate NI-424 at 85° C.

FIGS. 2A and 2B are bottom and top perspective views, respectively, of metal base 120. Metal base 120 is a copper lead frame that includes opposing major surfaces 122 and 124, central portion 126, slots 128, recessed portions 132 and 134, non-recessed portions 136 and leads 138. Slots 128 are formed in two parallel rows and extend between surfaces 122 and 124. Recessed portions 132 are formed in surface 124, extend into metal base 120 towards surface 122, and are between and adjacent to slots 128 in the same row. Recessed portions 134 are formed in surface 124, extend into metal base 120 towards surface 122, and are between and adjacent to slots 128 in separate rows. Non-recessed portions 136 are between and adjacent to slots 128 in the same row, and are adjacent to recessed portions 132. Leads 138 include recessed portions 132 and non-recessed portions 136.

Thus, recessed portions 132 and 134 are coplanar with non-recessed portions 136 at surface 122 and recessed relative to non-recessed portions 136 at surface 124. Leads 138 are arranged in two parallel rows, include opposing parallel outer edges defined by adjacent slots 128, and the outer edges extend across recessed portions 132 and non-recessed portions 136. The combination of slots 128, recessed portions 132 and recessed portions 134 provide a continuous rectangular channel that is adjacent to and extends 360 degrees around central portion 126, and slots 128 provide comb-like canals that extend outwardly from the channel. Metal base 120 includes other openings and notches that are used for tooling engagement and alignment purposes.

Metal base 120 has a thickness of 200 microns, slots 128 have a length of 1500 microns, a width of 300 microns and a center-to-center spacing of 800 microns, recessed portions 132 have a length and width of 500 microns and a depth of 120 microns, recessed portions 134 have a width of 500 microns and a depth of 120 microns, and leads 138 have a length of 1500 microns (500 microns at recessed portions 132 and 1000 microns at non-recessed portions 136), a width of 500 microns and a center-to-center spacing of 800 microns.

Figure 2F:
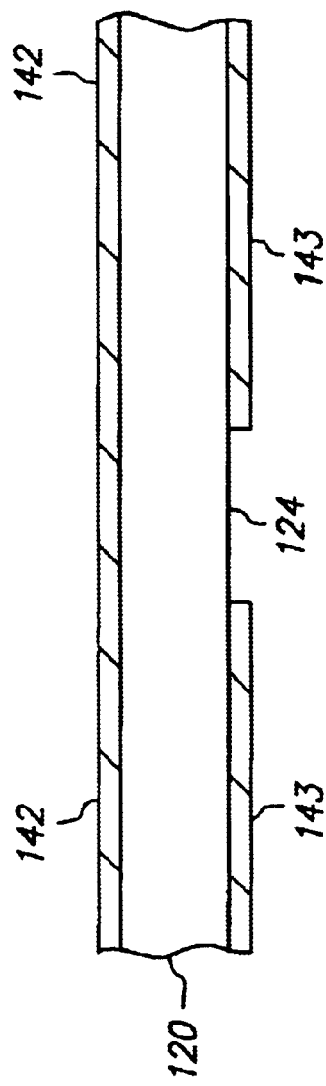
FIGS. 2F, 2G and 2H are enlarged cross-sectional views taken across line 2F—2F in FIGS. 2A and 2B that show the formation of a representative recessed portion in greater detail.
Figure 2G:
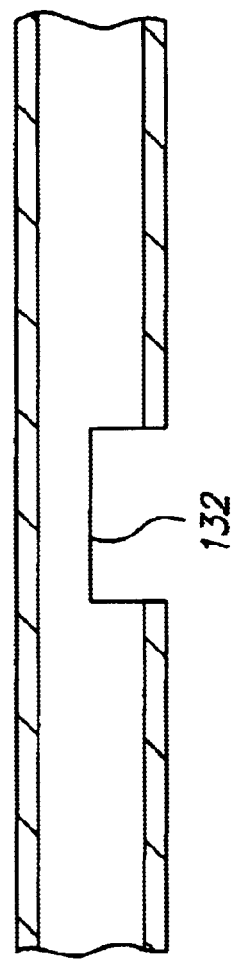
Figure 2H:
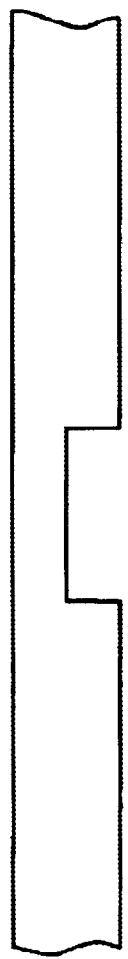

FIGS. 2C, 2D and 2E are enlarged cross-sectional views taken across line 2C—2C in FIGS. 2A and 2B that show the formation of a representative slot 128 in greater detail, and FIGS. 2F, 2G and 2H are enlarged cross-sectional views taken across line 2F—2F in FIGS. 2A and 2B that show the formation of a representative recessed portion 132 in greater detail.

FIGS. 2C and 2F are enlarged cross-sectional views of photoresist layers 142 and 143 formed on surfaces 122 and 124, respectively. Photoresist layers 142 and 143 are simultaneously deposited as continuous dry films and then patterned by selectively applying light through respective reticles (not shown), applying a developer solution to remove the photoresist portions rendered soluble by the light, and then hard baking, as is conventional. As a result, photoresist layer 142 contains openings that selectively expose portions of surface 122, and photoresist layer 143 contains openings that selectively expose portions of surface 124. Photoresist layers 142 and 143 have a thickness of 15 microns.

FIGS. 2D and 2G are enlarged cross-sectional views of various features formed in metal base 120 by wet chemical etching using photoresist layers 142 and 143 as etch masks. In particular, the structure is dipped in a wet chemical etch that provides a front-side etch through the openings in photoresist layer 142 to the exposed portions of surface 122 and a back-side etch through the openings in photoresist layer 143 to the exposed portions of surface 124. The structure is submerged in the wet chemical etch long enough for the etchant to etch about 120 microns into metal base 120. That is, the wet chemical etch provides a "half-etch" that removes slightly over one-half (120/200) the thickness of metal base 120 at the exposed portions. Thus, the front-side etch partially forms slot 128, the back-side etch partially forms slot 128 and completely forms recessed portion 132, and the combination of the front-side and back-side etches completely forms slot 128. Likewise, the front-side and back-side etches are applied simultaneously, and slot 128 and recessed portion 132 are formed simultaneously. The wet chemical etch also forms the other slots 128 and recessed portions 132 as well as recessed portions 134 and the unlabeled openings and notches in a similar manner.

A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing metal base 120 to the wet chemical etch to provide the desired etch depth can be established through trial and error.

FIGS. 2E and 2H are enlarged cross-sectional views of metal base 120 after photoresist layers 142 and 143 are simultaneously stripped.

Figure 3A:
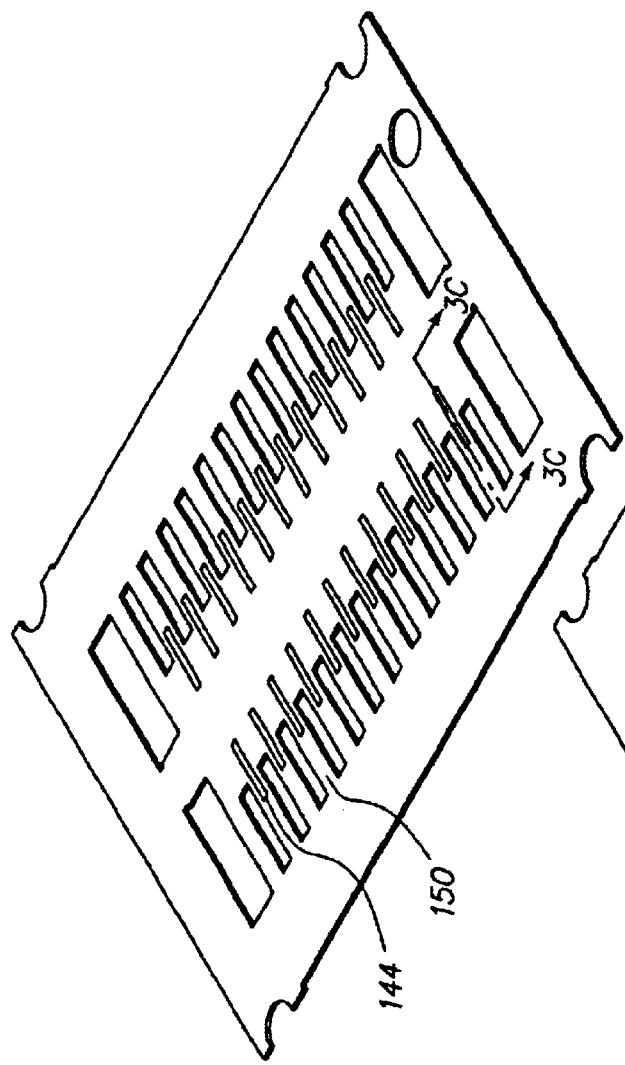
Figure 3B:
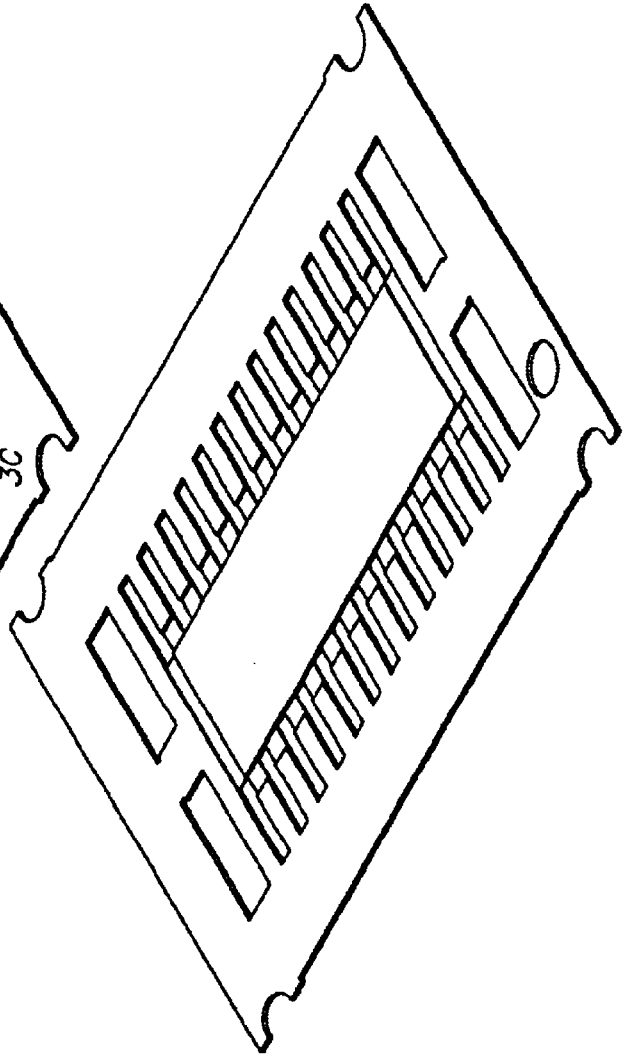

FIGS. 3A and 3B are bottom and top perspective views, respectively, of metal traces 144 formed on metal base 120. Metal traces 144 extend to leads 138. More particularly, metal traces 144 extend from central portion 126 to recessed portions 132 where they are centered between the adjoining slots 128 but do not extend to non-recessed portions 136. Accordingly, leads 138 and metal traces 144 are formed in one-to-one relation. Conductive traces 150 include leads 138 and metal traces 144.

Metal traces 144 are electroplated onto metal base 120. Metal traces 144 are composed of a first nickel layer electroplated onto metal base 120, a copper layer electroplated onto the first nickel layer, and a second nickel layer electroplated onto the copper layer. Thus, the first nickel layer is sandwiched between and contacts metal base 120 and the copper layer, the copper layer is sandwiched between and contacts the first and second nickel layers, and the second nickel layer contacts the copper layer and is exposed. The first and second nickel layers and the copper layer are shown as a single layer for convenience of illustration.

Metal traces 144 have a thickness of 10 microns provided by the first nickel layer with a thickness of 1 micron, the copper layer with a thickness of 8 microns, and the second nickel layer with a thickness of 1 micron. Metal traces 144 have a width (orthogonal to the elongated length) of 55 microns.

Figure 3C:
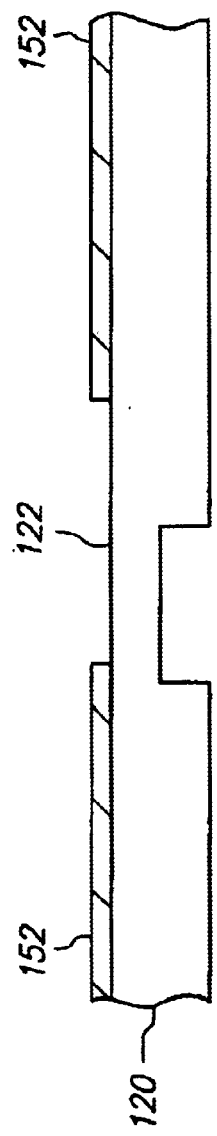
FIGS. 3C, 3D and 3E are enlarged cross-sectional views taken across line 3C—3C in FIG. 3A that show the formation of a representative metal trace in greater detail.
Figure 3D:
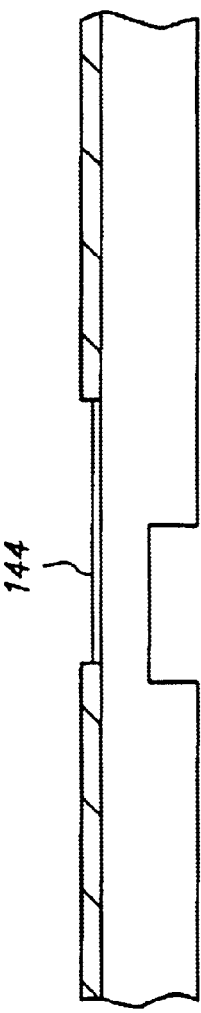
Figure 3E:

FIGS. 3C, 3D and 3E are enlarged cross-sectional views taken across line 3C—3C in FIG. 3A that show the formation of a representative metal trace 144 in greater detail.

FIG. 3C is an enlarged cross-sectional view of photoresist layer 152 formed on surface 122. Photoresist layer 152 is deposited as a continuous dry film and then patterned by selectively applying light through a reticle (not shown), applying a developer solution to remove the photoresist portions rendered soluble by the light and then hard baking, as is conventional. As a result, photoresist layer 152 contains an opening that selectively exposes a portion of surface 122. Photoresist layer 152 has a thickness of 15 microns.

FIG. 3D is an enlarged cross-sectional view of metal trace 144 formed on metal base 120. Metal trace 144 is formed in the opening in photoresist layer 152 and on the exposed portion of surface 122 by an electroplating operation using photoresist layer 152 as a plating mask. Thus, metal trace 144 is formed additively. Initially, a plating bus (not shown) is connected to metal base 120, current is applied to the plating bus from an external power source, and metal base 120 is submerged in an electrolytic nickel plating solution such as Technic Techni Nickel "S" at room temperature. As a result, the first nickel layer electroplates (deposits or grows) on the exposed portion of surface 122. The nickel electroplating operation continues until the first nickel layer has the desired thickness. Thereafter, the structure is removed from the electrolytic nickel plating solution and submerged in an electrolytic copper plating solution such as Sel-Rex CUBATH M™ at room temperature while current is applied to the plating bus to electroplate the copper layer on the first nickel layer. The copper electroplating operation continues until the copper layer has the desired thickness. Thereafter, the structure is removed from the electrolytic copper plating solution and submerged in an electrolytic nickel plating solution such as Technic Techni Nickel "S" at room temperature while current is applied to the plating bus to electroplate the second nickel layer on the copper layer. The nickel electroplating operation continues until the second nickel layer has the desired thickness. Thereafter, the structure is removed from the electrolytic nickel plating solution and rinsed in distilled water to remove contaminants.

FIG. 3E is an enlarged cross-sectional view of metal base 120 and metal trace 144 after photoresist layer 152 is stripped.

Figure 4A:
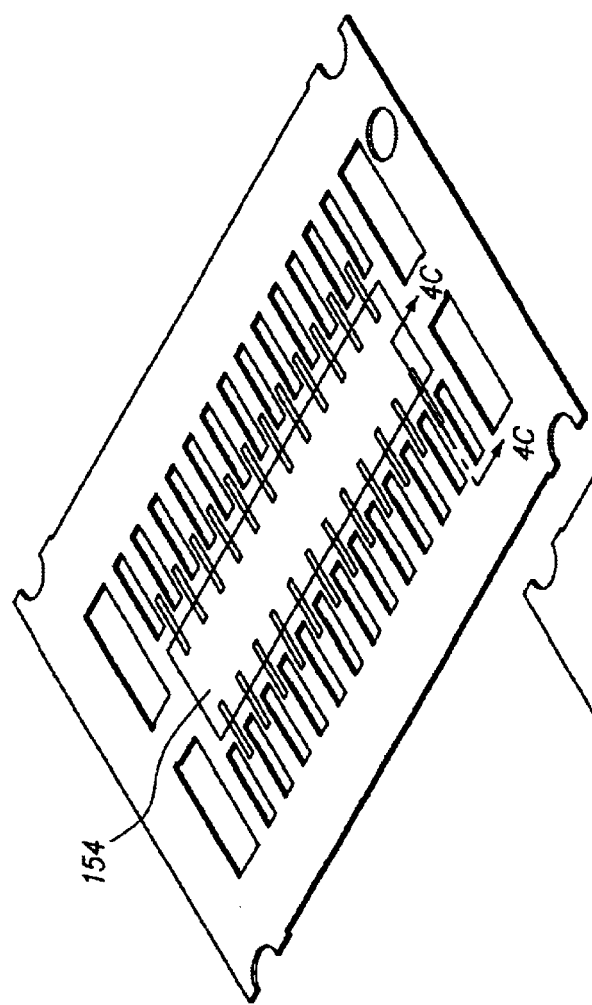
Figure 4B:
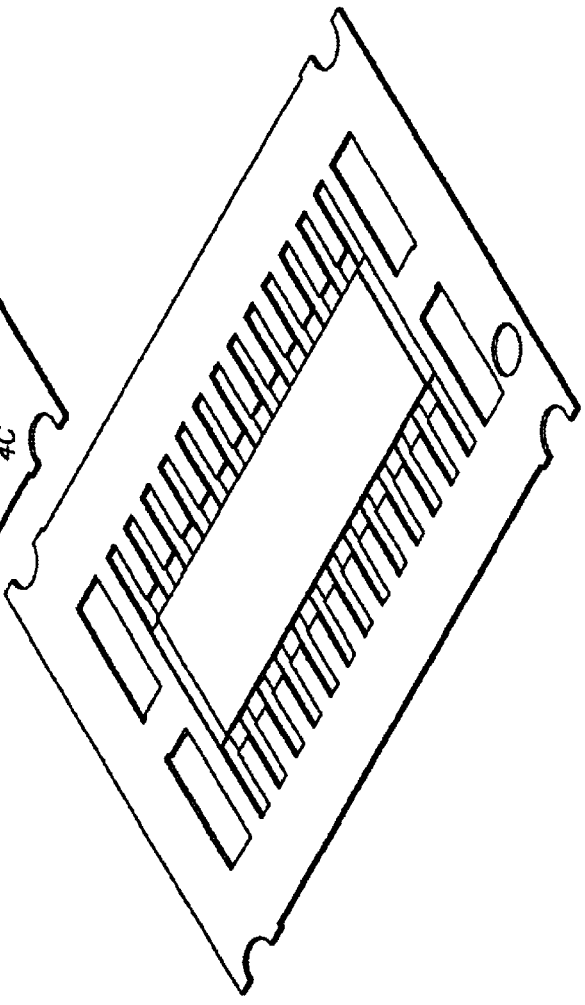

FIGS. 4A and 4B are bottom and top perspective views, respectively, of transparent adhesive 154 formed on metal base 120 and metal traces 144. Transparent adhesive 154 is initially clear TEFLON® synthetic polymeric resin (polytetrafluoroethylene) from E.I. Dupont Chemical Company. The liquid resin is applied over a predetermined portion of central portion 126 using stencil printing. During stencil printing, a stencil (not shown) is placed over metal base 120, a stencil opening is aligned with the predetermined portion, and then a squeegee (not shown) pushes the liquid resin along the surface of the stencil opposite metal base 120, through the stencil opening and onto the predetermined portion. Me liquid resin is compliant enough at room temperature to conform to virtually any shape. The predetermined portion of central portion 126 is slightly offset from the periphery of central portion 126. Therefore, the liquid resin does not reach surface 124 or slots 128. The liquid resin has a thickness of 30 microns over surface 122.

FIG. 4C is an enlarged cross-sectional view taken across line 4C—4C in FIG. 4A that shows the liquid resin on a representative metal trace 144 in greater detail.

FIGS. 5A and 5B are bottom and top perspective views, respectively, of chip 110 mechanically attached to metal base 120 by transparent adhesive 154. Transparent adhesive 154 is disposed between and contacts surface 112 of chip 110 and metal base 120, and is disposed between and contacts surface 112 of chip 110 and metal traces 144. Thus, surface 112 of chip 110 faces towards metal base 120 and metal traces 144 and is covered, and surface 114 of chip 110 faces away from metal base 120 and metal traces 144 and is exposed. Chip 110 and metal base 120 do not contact one another, and chip 110 and metal traces 144 do not contact one another.

Chip 110 and metal base 120 are positioned relative to one another so that chip 110 is disposed within the periphery of transparent adhesive 154, metal traces 144 extend within and outside the periphery of chip 110 and overlap and are electrically isolated from pads 116, and slots 128, recessed portions 132 and 134, non-recessed portions 136 and leads 138 are disposed outside the periphery of chip 110. Metal traces 144 overlap pads 116 in one-to-one relation. Thus, each pad 116 has an associated conductive trace 150 which includes a single lead 138 and metal trace 144.

Chip 110 and metal base 120 can be aligned using an automated pattern recognition system. Transparent adhesive 154 is sandwiched between chip 110 and metal base 120 using relatively low pressure. Thereafter, transparent adhesive 154 is heated and fully cured at relatively low temperature of about 150° C. to form a solid adhesive transparent electrically insulative die attach that mechanically fastens chip 110 to metal base 120 and metal traces 144. Transparent adhesive 154 is 10 microns thick between pads 116 and metal traces 144.

At this stage, metal base 120 provides a carrier for chip 110, and transparent adhesive 154 contacts and covers light sensitive cell 115 and pads 116.

Figure 5C:
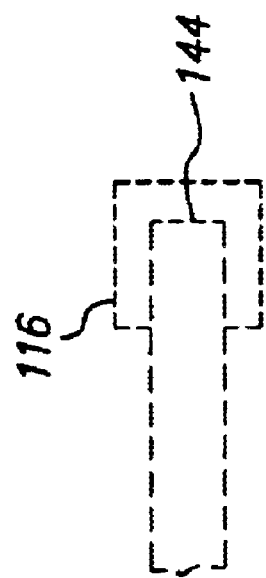
FIG. 5C is an enlarged plan view of encircled detail 5C in FIG. 5A that shows a representative pad and metal trace in greater detail.

FIG. 5C is an enlarged plan view of encircled detail 5C in FIG. 5A that shows a representative pad 116 and metal trace 144 in greater detail. Since pad 116 and metal trace 144 are not visible from surface 114 of chip 110, they are shown in phantom. Metal trace 144 includes a distal end that overlaps pad 116.

FIGS. 6A and 6B are bottom and top perspective views, respectively, of encapsulant 156 formed on chip 110 and metal base 120 by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

Initially the structure is accurately positioned within a mold (not shown). The mold contacts surfaces 122 and 124 slightly outside recessed portions 132 and 134, but does not contact or extend into recessed portions 132 and 134. The mold defines a box-shaped mold cavity that extends above surface 122, surrounds chip 110 and transparent adhesive 154, overlaps recessed portions 132 and 134, and slightly overlaps non-recessed portions 136. Thus, portions of slots 128 adjacent to recessed portions 132 extend into the mold cavity, while other portions of slots 128 adjacent to non-recessed portions 136 do not. Next, encapsulant 156 is introduced into the mold cavity as a liquid resin under pressure and then hardened to form a solid single-piece non-transparent molded plastic base during the transfer molding operation. Encapsulant 156 fills the mold cavity and contacts all exposed surfaces within the mold cavity. As a result, encapsulant 156 forms a box-shaped portion, shaped like the mold cavity, that contacts and extends above surface 114 and the outer side surfaces of chip 110, surface 122, metal traces 144 and transparent adhesive 154. Furthermore, encapsulant 156 fills slots 128 and recessed portions 132 and 134. That is, since slots 128 and recessed portions 132 and 134 form a continuous rectangular channel with outwardly extending comb-like canals, and encapsulant 156 enters slots 128 and recessed portions 132 and 134 under pressure, encapsulant 156 fills and assumes the shape of the channel and canals. However, surface 124 outside recessed portions 132 and 134 remains exposed, and encapsulant 156 does not contact (or contacts substantially none of) surface 124 outside recessed portions 132 and 134. Likewise, encapsulant 156 does not contact light sensitive cell 115 or pads 116.

Encapsulant 156 forms a first single-piece housing portion that includes bottom surface 160, four peripheral side surfaces 162 and top surface 164. Encapsulant 156 also includes peripheral portion 166 at top surface 164. Peripheral portion 166 has a rectangular shape (in the channel) with outwardly extending comb-like fingers (in the canals). Bottom surface 160 occupies the entire surface area between side surface 162, however top surface 164 does not. Peripheral portion 166 occupies a peripheral portion of the surface area between side surfaces 162 that is outside the periphery of chip 110 without occupying an inner central portion of the surface area between side surfaces 162. Central portion 126 is surrounded by, adjacent to and coplanar with peripheral portion 166, occupies the inner central portion and remains exposed Thus, top surface 164 of encapsulant 156 at peripheral portion 166 is coplanar with surface 124 of metal base 120 at central portion 126. In addition, encapsulant 156 completely surrounds leads 138. In particular, encapsulant 156 contacts the bottoms of recessed portions 132 at surface 122, the outer edges of recessed portions 132 at slots 128, and the tops of recessed portions 132 at surface 124, thereby forming lateral openings with sidewalls that contact and span 360 degrees around leads 138. As a result, encapsulant 156 interlocks leads 138, thereby enhancing the mechanical attachment between chip 110 and leads 138.

Encapsulant 156 is a solid adherent compressible protective layer that provides back-side environmental protection such as moisture resistance and particle protection for chip 110 as well as mechanical support for leads 138.

FIG. 6C is an enlarged cross-sectional view taken across line 6C—6C in FIG. 6A that shows encapsulant 156 filling a representative slot 128 in greater detail, and FIG. 6D is an enlarged cross-sectional view taken across line 6D—6D in FIG. 6A that shows encapsulant 156 filling a representative recessed portion 132 in greater detail.

FIGS. 7A and 7B are bottom and top perspective views, respectively, of encapsulant 156 removed from portions of slots 128 that laterally extend outwardly at side surfaces 162. In other words, the comb-like fingers of encapsulant 156 are selectively removed while the remainder of encapsulant 156 remains intact. This can be accomplished using a mechanical trimming operation. For instance, a mold die (not shown) with an excise blade and a base can be used. The excise blade contains two rows of comb-like blade portions that are aligned with and disposed above slots 128, and the base contains two rows of openings that are aligned with and disposed below slots 128 as the structure is spaced from the excise blade and rests on the base. The excise blade is then actuated toward the base such that each blade portion enters a corresponding slot 128 and cuts off the finger of encapsulant 156 within that slot.

At this stage, leads 138 are arranged in opposing rows that protrude laterally from and extend through two opposing side surfaces 162 of encapsulant 156.

FIG. 7C is an enlarged cross-sectional view taken across line 7C—7C in FIG. 7A that shows encapsulant 156 removed from a portion of a representative slot 128 in greater detail, and FIG. 7D is an enlarged cross-sectional view taken across line 7D—7D in FIG. 7A that shows encapsulant 156 intact in a representative recessed portion 132 in greater detail.

FIGS. 8A and 8B are bottom and top perspective views, respectively, of protective coating 170 formed on metal base 120 outside the periphery of encapsulant 156. Thus, protective coating 170 covers the exposed surfaces of metal base 120 outside central portion 126. More particularly, protective coating 170 covers the portions of leads 138 that protrude from encapsulant 156 as well as the remaining portions of metal base 120 outside leads 138. Protective coating 170 is electroplated onto metal base 120 and is composed of tin with a thickness of 20 microns. For convenience of illustration, protective coating 170 is considered a surface layer that is part of metal base 120 and leads 138.

Figure 8C:
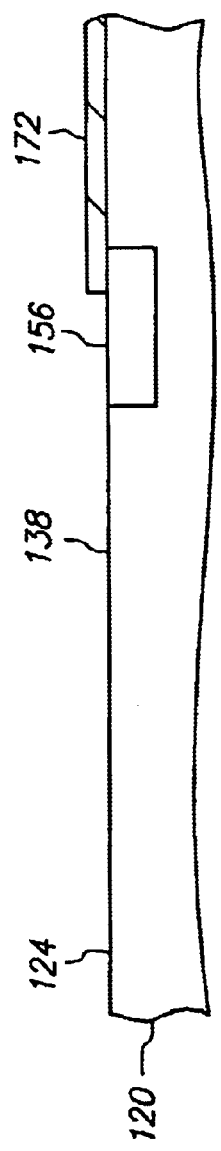
FIGS. 8C, 8D and 8E are enlarged cross-sectional views taken across line 8C—8C in FIG. 8B that show the formation of a protective coating in greater detail.
Figure 8D:
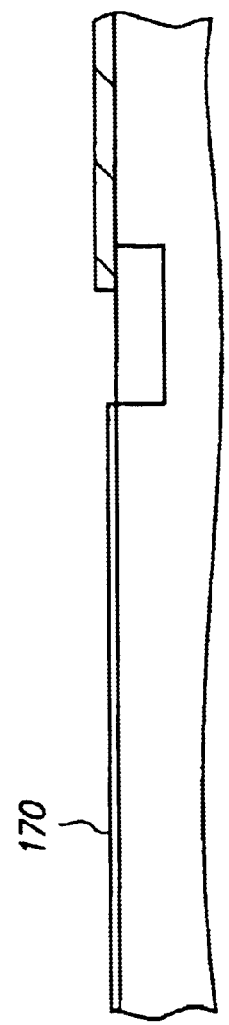
Figure 8E:

FIGS. 8C, 8D and 8E are enlarged cross-sectional views taken across line 8C—8C in FIG. 8B that show the formation of protective coating 170 in greater detail.

FIG. 8C is an enlarged cross-sectional view of ink layer 172 formed on surface 124. Ink layer 172 is deposited as a liquid resin (A stage) epoxy over central portion 126 using stencil printing. Thereafter, the liquid resin is cured or hardened at relatively low temperature of about 120° C. to form a solid layer. As a result, ink layer 172 covers central portion 126 at surface 124, overlaps encapsulant 156 at surface 164 and selectively exposes the remainder of metal base 120 outside encapsulant 156. Ink layer 172 has a thickness of 30 microns.

FIG. 8D is an enlarged cross-sectional view of protective coating 170 formed on metal base 120. Protective coating 170 is formed on the exposed portions of metal base 120 by an electroplating operation using ink layer 172 as a plating mask. Initially, a plating bus (not shown) is connected to metal base 120, current is applied to the plating bus from an external power source, and metal base 120 is submerged in an electrolytic tin plating solution such as Technic Techni NF MTB at room temperature. As a result, the tin electroplates on the exposed surfaces of metal base 120. The tin electroplating operation continues until the tin layer has the desired thickness. Thereafter, the structure is removed from the electrolytic tin plating solution and rinsed in distilled water to remove contaminants.

FIG. 8E is an enlarged cross-sectional view of metal base 120 and protective layer 170 after ink layer 172 is stripped using an alkaline solution that is highly selective of the epoxy ink with respect to tin, copper and the molding compound.

FIGS. 9A and 9B are bottom and top perspective views, respectively, of the structure after central portion 126 of metal base 120 is removed. The structure is dipped in a wet chemical etch that is highly selective of copper with respect to tin, nickel, the polymeric adhesive and the molding compound. Therefore, the wet chemical etch removes central portion 126 but has no appreciable effect on chip 110, leads 138, metal traces 144, transparent adhesive 154, encapsulant 156 and protective coating 170. As a result, metal traces 144 and transparent adhesive 154 become exposed. Peripheral portion 166 is shaped as a rectangular peripheral ledge with four inner side surfaces 174 previously adjacent to and covered by central portion 126 that become exposed. Inner side surfaces 174 are located within and face away from outer side surfaces 162, are orthogonal to top surface 164, and extend between transparent adhesive 154 and top surface 164.

A suitable wet chemical etch can be provided by the same solution used to form slots 128 and recessed portions 132 and 134. The optimal etch time for exposing the structure to the wet chemical etch without excessively exposing the portions of leads 138 embedded in peripheral portion 166 and adjacent to inner side surfaces 174 after the selected copper has been removed can be established through trial and error.

The wet chemical etch removes central portion 126 and reaches metal traces 144 and transparent adhesive 154. However, the first nickel layers of metal traces 144, which were electroplated on metal base 120, become the exposed surface layers for metal traces 144. Furthermore, metal traces 144 are embedded in and coplanar with transparent adhesive 154 at the exposed surface that was adjacent to central portion 126. Therefore, the exposed nickel surfaces of metal traces 144 and transparent adhesive 154 provide etch masks that protect the underlying copper layers (between the first and second nickel layers) of metal traces 144.

Advantageously, encapsulant 156 interlocks and provides mechanical support for leads 138, and therefore reduces the mechanical strain on transparent adhesive 154. The enhanced mechanical strength is particularly useful after central portion 126 has been removed.

At this stage, chip 110 remains embedded in transparent adhesive 154 and encapsulant 156, metal traces 144 overlap and remain electrically isolated from pads 116, and light sensitive cell 115 is visible through transparent adhesive 154.

FIGS. 10A and 10B are bottom and top perspective views, respectively, of the structure after portions of transparent adhesive 154 are selectively removed to form openings 176 in transparent adhesive 154 that expose pads 116. Openings 176 are formed by applying a suitable etch that is highly selective of transparent adhesive 154 with respect to pads 116 and metal traces 144.

In this instance, a selective laser etch is applied. Using projection laser ablation, a metal mask (not shown) is positioned relative to transparent adhesive 154 such that openings in the metal mask are aligned with pads, and a laser is directed to the side of the metal mask opposite transparent adhesive 154. Accordingly, the metal mask targets the laser at pads 116. The laser removes portions of transparent adhesive 154 above pads 116 and outside metal traces 144. Openings 176 have a diameter of 100microns, and pads 116 (with a length and width of 70 microns) are exposed by and axially aligned with openings 176. Metal traces 144 shield the underlying transparent adhesive 154 from the laser etch so that the portions of transparent adhesive 154 sandwiched between metal traces 144 and pads 116 remain intact. Openings 176 are formed in transparent adhesive 154 without damaging pads 116, passivation layer 118 and metal traces 144. Thus, openings 176 extend through transparent adhesive 154, but do not extend into chip 110.

Figure 10C:
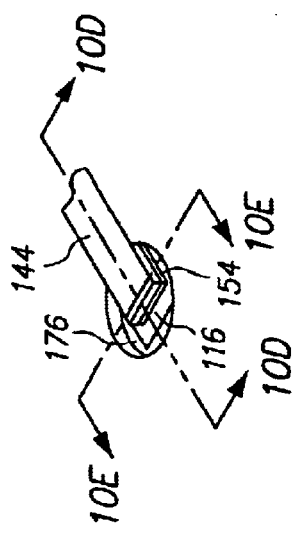
FIG. 10C is an enlarged perspective view of encircled detail 10C in FIG. 10B that shows a representative pad, metal trace and opening in greater detail.
Figure 10D:
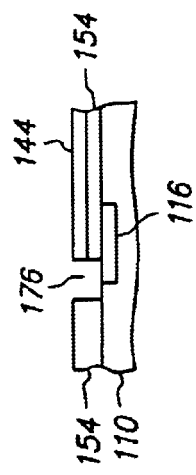
FIGS. 10D and 10E are enlarged cross-sectional views taken across lines 10D—10D and 10E—10E, respectively, in FIG. 10C.
Figure 10E:
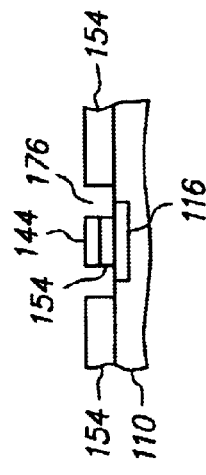

FIG. 10C is an enlarged perspective view of encircled detail 10C in FIG. 10B that shows a representative pad 116, metal trace 144 and opening 176 in greater detail, and FIGS. 10D and 10E are enlarged cross-sectional views taken across lines 10D—10D and 10E—10E, respectively, in FIG. 10C.

Figure 11A:
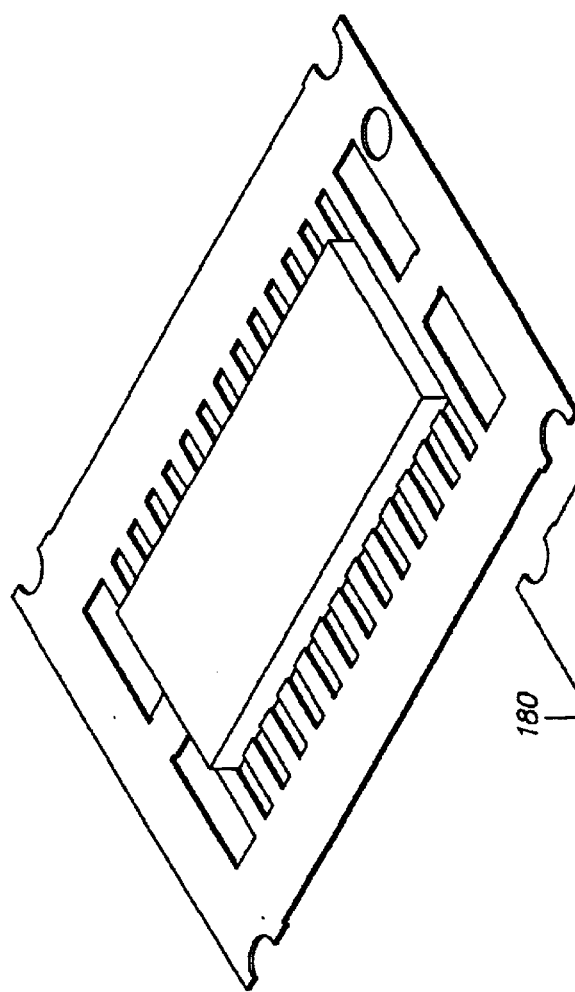
Figure 11B:
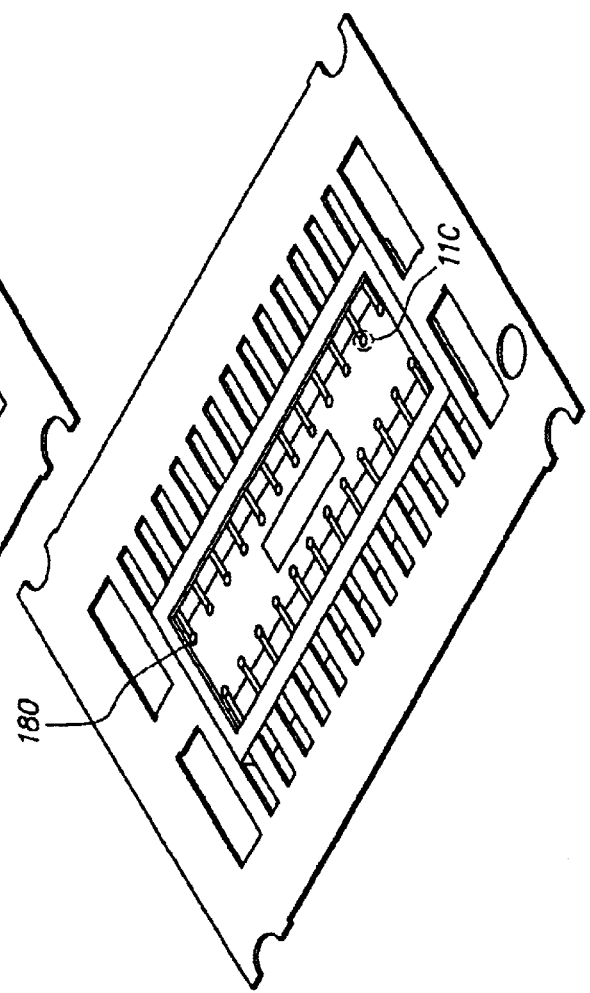

FIGS. 11A and 11B are bottom and top perspective views, respectively, of connection joints 180 formed on pads 116 and metal traces 144 by ball bonding.

Connection joints 180 are formed in openings 176 and contact pads 116 and metal traces 144, thereby electrically connecting pads 116 and metal traces 144. Connection joints 180 are composed of gold and are formed by thermosonic wire bonding. Preferably, the regions of pads 116 and metal traces 144 that are within or exposed by openings 176 are spot plated with silver having a thickness 3 microns. Silver is particularly well-suited for receiving a gold ball bond connection joint, and the nickel between the silver and the copper prevents the formation of brittle silver-copper intermetallic compounds. Thereafter, a capillary with a gold wire ball is positioned above opening 176, the capillary moves downward such that the wire ball enters opening 176 and contacts pad 116 and metal trace 144 while the capillary is heated to about 150 to 200° C., and the capillary exerts a downward force of about 25 to 45 grams and provides horizontal ultrasonic oscillatory motions with a frequency of about 60 to 120 kHz. The combination of heat, pressure and ultrasonic vibration places the wire ball in a soft state which is easy to deform and forms a ball bond that contacts and is metallurgically bonded to pad 116 and metal trace 144. Thereafter, the capillary moves upward and away from the ball bond without exerting upward pressure on the ball bond, and the ball bond cools and solidifies. The solidified ball bond forms connection joint 180 and the capillary moves in a horizontal loop and then downward with a force of 70 to 90 grams to cut the gold wire from connection joint 180. The process is repeated to form other connection joints 180 for corresponding pairs of pads 116 and metal traces 144.

Connection joints 180 are formed in openings 176 and contact and electrically connect pads 116 with metal traces 144. Connection joints 180 contact and cover portions of pads 116 beneath openings 176 and outside metal traces 144, the surfaces of metal traces 144 that overlap and face away from pads 116, and the outer edges (or three peripheral sidewalls) of metal traces 144 that overlap and are orthogonal to pads 116. Thus, connection joints 180 provide robust, permanent electrical connections between pads 116 and metal traces 144.

Connection joints 180 are the only electrical conductors external to chip 110 that contact pads 116, transparent adhesive 154 and connection joints 180 are the only materials external to chip 110 that contact pads 116, and transparent adhesive 154 and connection joints 180 are the only materials that contact both pads 116 and metal traces 144.

Figure 11C:
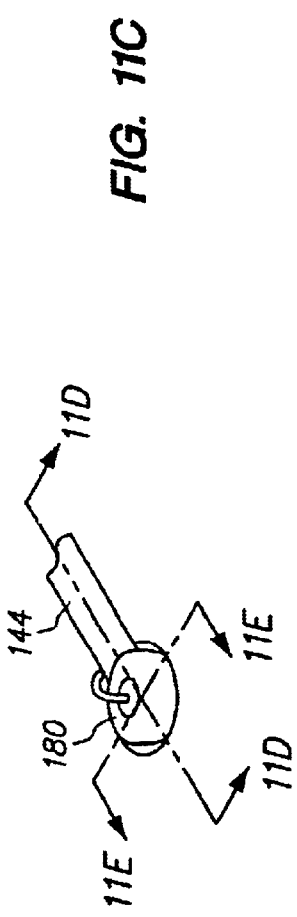
FIG. 11C is an enlarged perspective view of encircled detail 11C in FIG. 11B that shows a representative pad, metal trace, opening and connection joint in greater detail.
Figure 11D:
FIGS. 11D and 11E are enlarged cross-sectional views taken across lines 11D—11D and 11E—11E, respectively, in FIG. 11C.
Figure 11E:
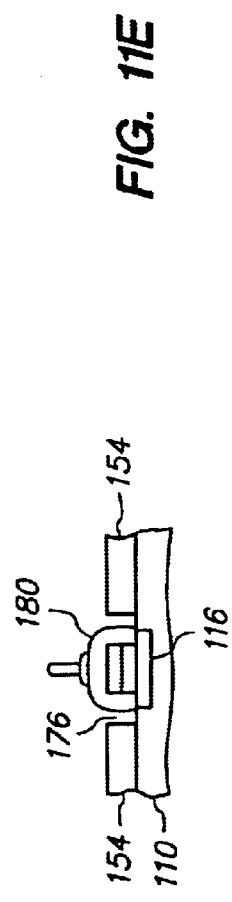

FIG. 11C is an enlarged perspective view of encircled detail 11C in FIG. 11B that shows a representative pad 116, metal trace 144, opening 176 and connection joint 180 in greater detail, and FIGS. 11D and 11E are enlarged cross-sectional views taken across lines 11D—11D and 11E—11E, respectively, in FIG. 11C.

Figure 12A:
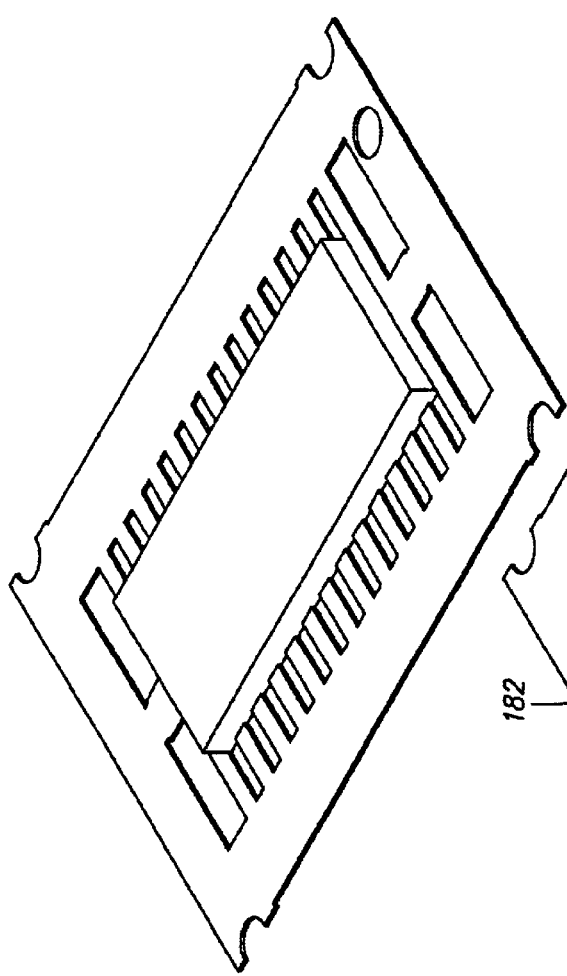
Figure 12B:
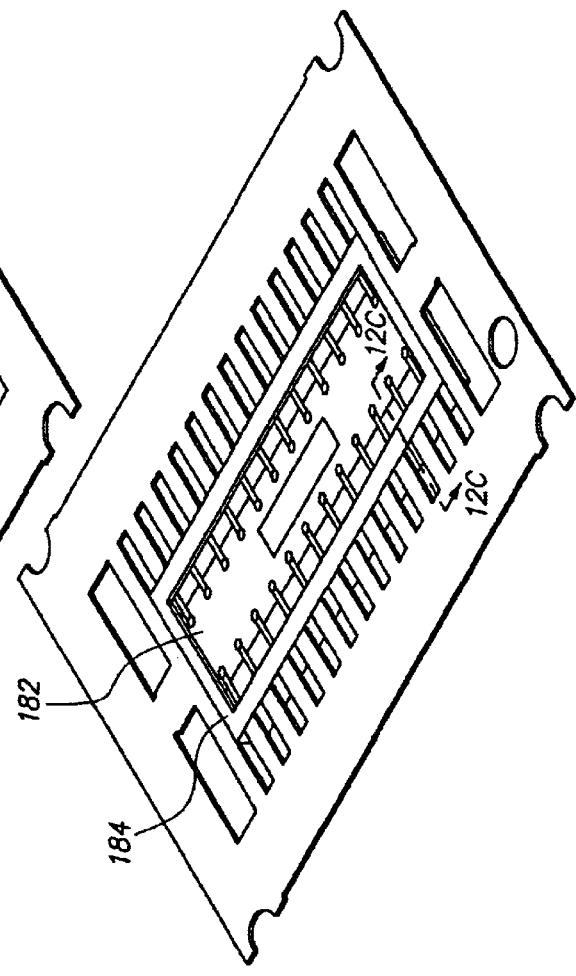

FIGS. 12A and 12B are bottom and top perspective views, respectively, of transparent base 182 disposed on the structure. Transparent base 182 is initially clear TEFLON® synthetic polymeric resin (polytetrafluoroethylene). The polymeric resin is deposited on the exposed portions of chip 110, metal traces 144, transparent adhesive 154 and connection joints 180 using stencil printing. The polymeric resin is compliant enough at room temperature to conform to virtually any shape, and therefore fills the remaining space in openings 176. Thereafter, the polymeric resin is cured or hardened at a relatively low temperature of about 150° C. to form transparent base 182 as a solid single-piece transparent polymeric layer.

Transparent base 182 is disposed directly above light sensitive cell 115. Furthermore, transparent adhesive 154 and transparent base 182 are optically clear to visible light. Therefore, transparent adhesive 154 and transparent base 182 provide an optical window for light sensitive cell 115. Visible light from the external environment that impinges upon transparent base 182 passes through transparent base 182, impinges upon transparent adhesive 154, passes through transparent adhesive 154 and impinges upon light sensitive cell 115.

Transparent base 182 has a planar top surface and a thickness of 50 microns relative to transparent adhesive 154. Transparent base 182 contacts portions of inner side surfaces 174 adjacent to transparent adhesive 154 and covers the entire surface area formerly occupied by central portion 126. As a result, encapsulant 156 and transparent base 182 in combination form insulative housing 184 that surrounds and encapsulates chip 110. Insulative housing 184 includes top surface 164 formed by peripheral portion 166 and transparent base 182. Thus, peripheral portion 166 forms a rectangular peripheral ledge of top surface 164, and transparent base 182 forms a recessed central portion of top surface 164. Peripheral portion 166 protrudes 150 microns (200−50) above transparent base 182. However, transparent base 182 forms a central portion of top surface 164 of insulative housing 184 even though peripheral portion 166 forms a peripheral ledge of top surface 164 that protrudes above transparent base 182.

FIG. 12C is an enlarged cross-sectional view taken across line 12C—12C in FIG. 12B that shows transparent base 182 in greater detail.

Figure 13A:
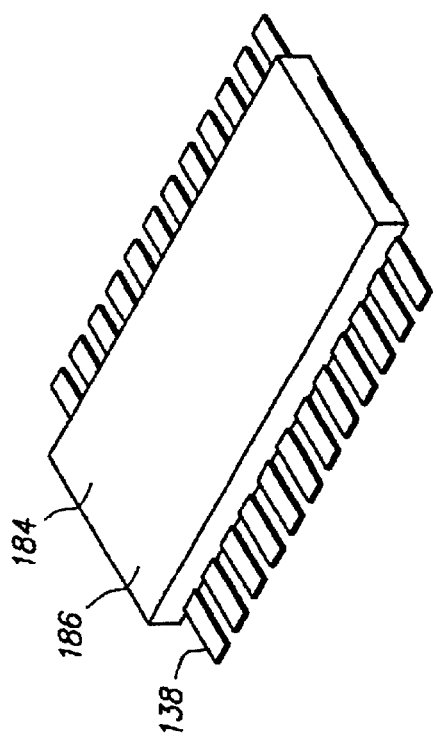
Figure 13B:
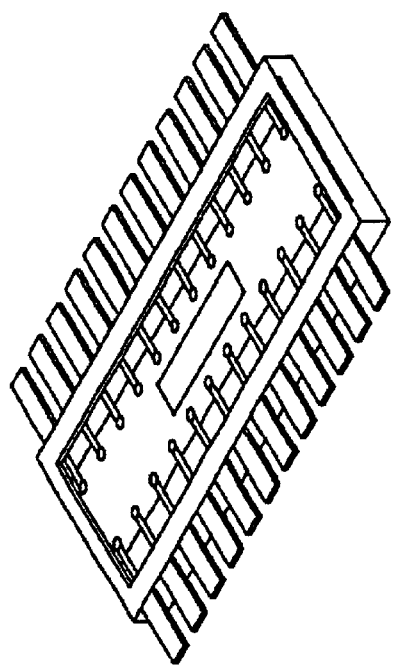

FIGS. 13A and 13B are bottom and top perspective views, respectively, of the structure after metal base 120 outside leads 138 and insulative housing 184 is removed. In other words, metal base 120 is selectively cut to remove all portions of metal base 120, except for leads 138, outside insulative housing 184, while leads 138 and insulative housing 184 remain intact This can be accomplished using an excise blade that selectively cuts metal base 120 at predetermined regions adjacent to leads 138 and insulative housing 184. As a result, optoelectronic semiconductor package device 186 is singulated from the lead frame.

At this stage, device 186 includes chip 110, conductive traces 150, transparent adhesive 154, connection joints 180 and insulative housing 184. Conductive traces 150 each include a lead 138 that protrudes laterally from and extends through a side surface 162 of insulative housing 184, and a metal trace 144 within insulative housing 184 that contacts an associated lead 138 and connection joint 180. Conductive traces 150 are electrically connected to pads 116 by connection joints 180 in one-to-one relation, and are electrically isolated from one another. Leads 138 are arranged in opposing rows that protrude laterally from and extend through opposing side surfaces 162 and are disposed between top surface 164 and bottom surface 160. Furthermore, light sensitive cell 115 is protected by and receives incident light from the external environment through transparent adhesive 154 and transparent base 182.

Figure 14A:
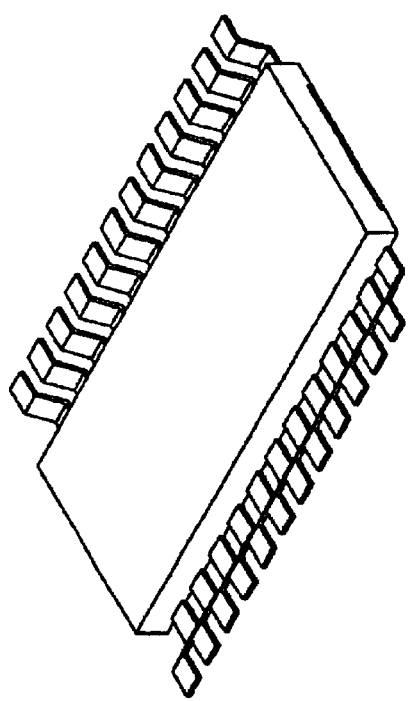
Figure 14B:
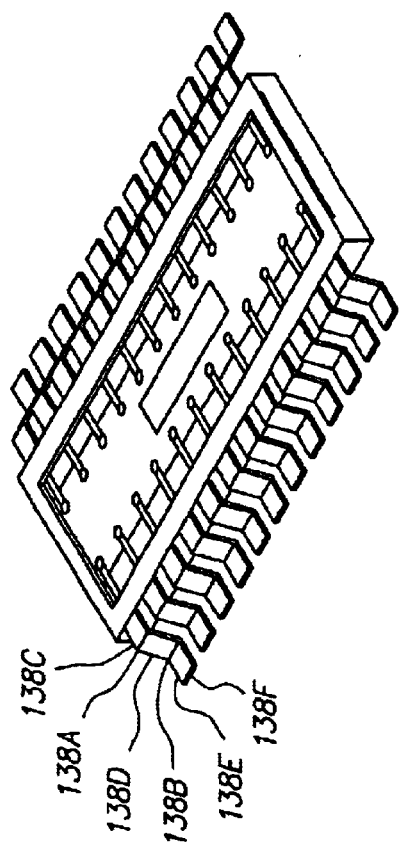

FIGS. 14A and 14B are bottom and top perspective views, respectively, of device 186 after leads 138 are bent. Leads 138 are bent at inner corners 138A and outer corners 138B using a conventional lead forming tool. As a result, leads 138 include inner lateral portions 138C between inner corners 138A and insulative housing 184, vertical portions 138D between corners 138A and 138B, and outer lateral portions 138E between outer corners 138B and distal ends 138F. Lateral portions 138C and 138E are parallel to bottom surface 160 and parallel to one another. Vertical portions 138D are sloped and extend laterally away from inner lateral portions 138C with increasing vertical distance from inner lateral portions 138C. Outer lateral portions 138E are disposed beneath bottom surface 160. Thus, the lead bending operation moves distal ends 138F from between top surface 164 and bottom surface 160 to outside top surface 164 and bottom surface 160 such that distal ends 138F extend vertically beyond insulative housing 184. Furthermore, the lead bending operation converts leads 138 from straight planar leads to gullwing-shaped leads and device 186 becomes a thin small outline package (TSOP).

The optoelectronic semiconductor package device described above is merely exemplary. Numerous other embodiments are contemplated.

The light sensitive cell can include a wide variety of light sensitive elements designed to selectively or continuously receive light in a selected frequency range during normal operation of the chip. For instance, the light sensitive cell can be designed to receive visible, ultraviolet or infrared light, combinations thereof, and selected frequencies thereof.

The pads can have numerous shapes including a flat rectangular shape and a bumped shape. For instance, a bump-shaped pad may extend into the opening and may even extend above the conductive trace. The pads can either be partially or completely exposed prior to forming the connection joints. The pads can have a length and width that are larger than, equal to, or smaller than the diameter of the openings. Preferably, the pads and openings have the same or similar size, and a substantial portion of the pads is directly beneath the openings.

The conductive traces can have various shapes and sizes. The conductive traces can overlap various portions of the pads, such as one peripheral edge and the center of the pad (FIG. 10C), two opposing peripheral edges and the center of the pad, three peripheral edges but not the center of the pad, two corners and the center of the pad, or four peripheral edges but not the center of the pad.

The conductive traces can be various conductive metals including copper, gold, nickel, aluminum, palladium, tin, combinations thereof, and alloys thereof The preferred composition of the conductive traces will depend on the nature of the connection joints as well as design and reliability factors. Furthermore, those skilled in the art will understand that in the context of a semiconductor package device, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive traces may function as a signal, power or ground layer depending on the purpose of the associated chip pads. Likewise, the conductive traces can fan-in, fan-out or both.

The metal traces can be a single layer or multiple layers. For instance, the metal trace can be a 5 micron layer of gold, or alternatively, a 45 micron layer of nickel electroplated on a 0.5 micron layer of gold electroplated on a copper base to reduce costs, or alternatively, a 4 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the metal trace can include a non-copper layer between a copper layer and the metal base. Suitable non-copper layers include nickel, gold, palladium and silver. After the metal trace is attached to the chip by the adhesive, a wet chemical etch can be applied that is highly selective of copper with respect to the non-copper layer to remove the copper base without removing the copper or non-copper layers. The non-copper layer provides an etch stop that prevents the wet chemical etch from removing the copper layer. Furthermore, it is understood that in the context of the present invention, the metal trace and the metal base are different metals (or metallic materials ) even if a multi-layer metal trace includes a single layer that is similar to the metal base (such as the example described above).

The metal base can be various metals such as copper, gold, nickel, aluminum, palladium, tin, combinations thereof, and alloys thereof, and can be a single layer or multiple layers.

The metal base can be etched in numerous manners. For instance, portions of the metal base above the pads can be selectively etched to permit formation of the openings in the adhesive, and other portions of the metal base can remain intact and connected to the conductive traces. Alternatively, portions of the metal base above the pads can be selectively etched to permit formation of the openings, and other portions of the metal base that are isolated from the conductive traces and disposed within the periphery of the chip can remain intact and provide beat sinks.

The transparent base can be a wide variety of optically clear materials including semi-transparent and substantially transparent materials. For instance, the transparent base can be a polymeric material such as polytetrafluoroethylene, water white clear epoxy, or EPO-TEK® 301 and 301-2FL from Epoxy Technology, ken that is deposited on the structure and then cued to form a solid adherent layer. Alternatively, the transparent base can be a solid cover, such as borosilicate glass, plastic, polycarbonate or quartz that is deposited on the structure as a solid layer and attached to the structure using an adhesive. In either case, the transparent base can contact or be spaced from the light sensitive cell. Preferably, the transparent base is optically clear to the selected frequencies of light that the light sensitive cell is designed to sense so that the selected frequencies of light from the external environment that impinge upon the transparent base pass through the transparent base with little or no attenuation or distortion and impinge upon the light sensitive cell.

The adhesive can be applied between the chip and the conductive trace in numerous manners. For instance, the adhesive can be applied as a paste, a laminated layer, or a liquid applied by screen-printing, spin-on, or spray-on. If paste or liquid adhesives are applied, the adhesive may contact the metal base, whereas if laminated adhesives are applied then no appreciable amount of adhesive may contact the metal base. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable.

The adhesive can be transparent or non-transparent. A transparent adhesive can be a wide variety of optically clear materials, including polymeric materials such as polytetrafluoroethylene, water white clear epoxy, EPO-TEK® 301 and 301-2FL from Epoxy Technology, Inc. and other semi-transparent and substantially transparent materials. Preferably, a transparent adhesive is optically dear to the selected frequencies of light that the light sensitive cell is designed to sense so that the selected frequencies of light from the external environment that impinge upon the transparent adhesive pass through the transparent adhesive with little or no attenuation or distortion and impinge upon the light sensitive cell.

A non-transparent adhesive can also be used. Preferably, a non-transparent adhesive does not contact or cover any portion of the light sensitive cell. For example, a non-transparent adhesive can be formed on the metal base as a peripheral ledge with a central opening, the chip can be positioned so that the non-transparent adhesive contacts the pads without contacting the light sensitive cell, and then the transparent base can be deposited on the light sensitive cell. As another example, a non-transparent adhesive can be deposited on the metal base, the chip can be positioned so that the non-transparent adhesive contacts the pads and the light sensitive cell, the portion of the non-transparent adhesive that contacts the light sensitive cell can be removed, for instance by selective laser ablation or blanket plasma etching as the pads are exposed, and then the transparent base can be deposited on the light sensitive cell.

The openings can be formed in the adhesive either before or after mechanically attaching the chip to the conductive traces. For instance, the adhesive can be applied as a liquid or paste (A stage) to the bottom surface of the conductive traces, the adhesive can be partially cured (B stage), a back-side etch can form the openings in the adhesive, the partially cured adhesive can be brought into contact with the chip, and then the adhesive can be fully cured (C stage). Alternatively, the liquid or paste adhesive can be sandwiched between the chip and the conductive traces, the adhesive can be fully cured thereby mechanically fastening the chip to the conductive traces, and then a front-side etch can form the openings in the adhesive.

The openings can be formed with numerous etching techniques. For instance, the openings can be formed by laser direct write (without a mask) or a blanket plasma etch that removes portions of the adhesive not covered by the conductive traces. In addition, the openings can have a circular, ovalar, square, rectangular or other shape. The openings may be aligned with and expose single pads or a plurality of pads. Furthermore, the openings can have sidewalls with a wide variety of shapes and slopes including vertical sidewalls, tapered sidewalls, continuous sidewalls and stepped sidewalls.

The encapsulant can be formed using a wide variety of techniques including printing and transfer molding. For instance, the encapsulant can be an epoxy paste that is deposited and then cured or hardened. The encapsulant can be any of the adhesives mentioned above. Moreover, the encapsulant need not necessarily contact the chip. For instance, a glob-top coating can be deposited on the chip after mechanically attaching the chip to the conductive traces, and then the encapsulant can be formed on the glob-top coating.

The insulative housing can include a wide variety of insulative housing portions. For example, if a transparent adhesive contacts the light sensitive cell, and a transparent base contacts the transparent adhesive and is spaced from the light sensitive cell, then the encapsulant provides a first single-piece housing portion, the transparent base provides a second single-piece housing portion, the transparent adhesive provides a third single-piece housing portion, and the transparent adhesive and transparent base provide an optical window for the light sensitive cell. As another example, if a non-transparent adhesive is spaced from the light sensitive cell, and a transparent base contacts the light sensitive cell, then the encapsulant provides a first single-piece housing portion, the transparent base provides a second single-piece housing portion, and the transparent base alone provides an optical window for the light sensitive cell. As another example, if a transparent adhesive contacts the light sensitive cell, and the transparent base is omitted such that a side of the transparent adhesive opposite the chip is exposed, then the encapsulant provides a first single-piece housing portion, the transparent adhesive provides a second single-piece housing portion, and the transparent adhesive alone provides an optical window for the light sensitive cell.

The connection joints can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joints depends on the composition of the conductive traces as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference.

The conductive traces can be formed and attached to the chip by a wide variety of lead-on-chip (LOC) and other connection techniques. See, for instance, U.S. application Ser. No. 09/878,649 filed Jun. 11, 2001 by Charles W. C. Lin entitled "Method of Making a Semiconductor Chip Assembly with a Conductive Trace Subtractively Formed Before and After Chip Attachment," U.S. application Ser. No. 09/878,626 filed Jun. 11, 2001 by Charles W. C. Lin entitled "Method of Connecting a Conductive Trace to a Semiconductor Chip," U.S. application Ser. No. 09/939,140 filed Aug. 24, 2001 by Charles W. C. Lin entitled "Semiconductor Chip Assembly with Interlocked Conductive Trace," and U.S. application Ser. No. 09/962,754 filed Sep. 24, 2001 by Charles W. C. Lin entitled "Method of Connecting a Conductive Trace and an Transparent base to a Semiconductor Chip," each of which is incorporated by reference. Conventional wire bonding, TAB and flip-hip techniques can also be employed. With conventional wire bonding, TAB and flip-chip techniques, the connection joints between the conductive traces and the pads can be formed before the encapsulant is formed.

The "upper" and "lower" surfaces of the chip and the "top" and "bottom" surfaces of the insulative housing do not depend on the orientation of the device, as will be readily apparent to those skilled in the art. For instance, the upper surface of the chip includes the light sensitive cell and the pads, regardless of whether the chip is inverted, and regardless of whether the device is inverted and/or mounted on a printed circuit board. Similarly, the upper surface of the chip faces and is covered by the top surface of the insulative housing, and the lower surface of the chip faces and is covered by the bottom surface of the insulative housing, regardless of whether the device is inverted, rotated or slanted. Likewise, the device is shown with a single orientation throughout the drawings for ease of comparison between the figures, although the device may be inverted at various manufacturing stages. For instance, the metal base should be inverted so that the bottom surface faces upward when the adhesive is deposited on the metal base.

The optoelectronic semiconductor package device of the present invention can have a wide variety of packaging formats as required by the next level assembly. For instance, the conductive traces can be configured so that the device is a surface mount technology (SMT) package such as a small outline package (SOP), thin small outline package (TSOP), quad flat package (QFP), plastic leadless chip carrier (PLCC) or small outline J-lead package (SOJ). The conductive traces can also be configured so that the device is a through-hole package such as a dual in-line package (DIP), single in-line package (SIP) or zig-zag in-line package (ZIP). The conductive traces can also be configured so that the device is a grid array such as a ball grid array (BGA), column grid array (CGA), land grid array (LGA) or pin grid array (PGA).

Advantageously, the optoelectronic semiconductor package device of the present invention is reliable and inexpensive. The encapsulant and the transparent base protect the chip from handling damage and provide a known dielectric barrier for the conductive traces. The encapsulant also provides critical mechanical support for the conductive traces after the metal base is etched. The mode of the connection between the chip and the conductive traces shifts from the initial mechanical coupling to metallurgical coupling to assure sufficient metallurgical bond strength. Furthermore, the conductive traces can be mechanically and metallurgically couple to the chip without wire bonding, TAB or solder joints, although the process is flexible enough to accommodate these techniques if desired. As a result, the device significantly enhances throughput, yield and performance characteristics compared to conventional packaging techniques. Moreover, the device is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. An optoelectronic semiconductor package device, comprising:
    a semiconductor chip that includes an upper surface and a lower surface, wherein the upper surface includes a light sensitive cell and a conductive pad;
    an insulative housing that includes a first single-piece non-transparent insulative housing portion that contacts the lower surface and is spaced from the light sensitive cell and a second transparent insulative housing portion that contacts the first housing portion and the light sensitive cell, wherein the first housing portion includes a peripheral ledge, and the second housing portion is exposed within the peripheral ledge; and
    a conductive trace that extends outside the insulative housing and is electrically connected to the pad inside the insulative housing.

2. The device of claim 1, wherein the first housing portion contacts four outer side surfaces of the chip.

3. The device of claim 1, wherein the first housing portion is spaced from the upper surface.

4. The device of claim 1, wherein the second housing portion contacts the conductive trace.

5. The device of claim 1, wherein the second housing portion is spaced from the lower surface.

6. The device of claim 1, wherein the second housing portion is recessed relative to the peripheral ledge.

7. The device of claim 1, wherein the first housing portion is a transfer molded material, and the second housing portion is a cured polymeric material.

8. The device of claim 1, wherein the conductive trace extends through a peripheral side surface of the first housing portion and contacts the second housing portion without extending through a surface of the second housing portion.

9. The device of claim 1, wherein the device is devoid of an electrical conductor that extends through opposing surfaces of the second housing portion.

10. The device of claim 1, wherein the device is devoid of wire bonds, TAB leads and solder joints.

11. An optoelectronic semiconductor package device, comprising:
    a semiconductor chip that includes an upper surface, a lower surface and outer side surfaces between the upper and lower surfaces, wherein the upper surface includes a light sensitive cell and a conductive pad;
    an insulative housing that includes a first single-piece non-transparent insulative housing portion that contacts the lower surface and the side surfaces and is spaced from the upper surface and a second transparent insulative housing portion that contacts the first housing portion and the light sensitive cell and is spaced from the lower surface; and
    a conductive trace that extends laterally through an opening in the first housing portion, extends outside the insulative housing and is electrically connected to the pad inside the insulative housing, wherein the first housing portion spans 360 degrees around the conductive trace at the opening.

12. The device of claim 11, wherein the second housing portion includes first and second opposing surfaces, the first surface contacts the light sensitive cell and is spaced from the conductive trace, and the second surface faces away from the chip and is exposed.

13. The device of claim 12, wherein the first housing portion includes a peripheral ledge, and the second housing portion is located within the peripheral ledge.

14. The device of claim 13, wherein the second housing portion is recessed relative to the peripheral ledge.

15. The device of claim 11, wherein the first housing portion is a transfer molded material, and the second housing portion is a cured polymeric material.

16. The device of claim 11, wherein the insulative housing consists of the first and second housing portions.

17. The device of claim 11, wherein the first housing portion is a transfer molded material that includes a peripheral ledge, and the second housing portion is a cured polymeric material that is located within the peripheral ledge and includes a first surface that contacts the light sensitive cell and is spaced from the conductive trace and a second surface opposite the first surface that faces away from the chip and is exposed.

18. The device of claim 11, wherein the conductive trace extends through a peripheral side surface of the first housing portion and contacts the second housing portion without extending through a surface of the second housing portion.

19. The device of claim 11, wherein the device is devoid of an electrical conductor that extends through opposing surfaces of the second housing portion.

20. The device of claim 11, wherein the device is devoid of wire bonds, TAB leads and solder joints.

21. An optoelectronic semiconductor package device, comprising:
    a semiconductor chip that includes an upper surface, a lower surface and four outer side surfaces between the upper and lower surfaces, wherein the upper surface includes a light sensitive cell and a conductive pad;
    an insulative housing that includes a top surface, a bottom surface and peripheral side surfaces between the top and bottom surfaces, wherein the insulative housing further includes first and second insulative housing portions, the first housing portion is a single-piece that contacts the chip, provides the peripheral side surfaces and the bottom surface and is non-transparent, and the second housing portion contacts the upper surface, is farther from the bottom surface than the lower surface is from the bottom surface, does not extend across any of the peripheral side surfaces, provides at least a portion of the top surface, is transparent and is exposed; and a conductive trace that extends outside the insulative housing and is electrically connected to the pad inside the insulative housing.

22. The device of claim 21, wherein the first housing portion contacts the lower surface and the outer side surfaces and is spaced from the upper surface.

23. The device of claim 21, wherein the second housing portion contacts the light sensitive cell and the conductive trace and is spaced from the lower surface.

24. The device of claim 21, wherein the first housing portion includes a peripheral ledge that forms a peripheral portion of the top surface, and the second housing portion is located within and recessed relative to the peripheral ledge.

25. The device of claim 21, wherein the first housing portion is a transfer molded material, and the second housing portion is a cured polymeric material.

26. The device of claim 21, wherein the insulative housing consists of the first and second housing portions.

27. The device of claim 21, wherein the light sensitive cell contacts a major surface of the second housing portion that faces towards and is parallel to the upper surface.

28. The device of claim 21, wherein the device is devoid of an electrical conductor that extends through the top or bottom surfaces.

29. The device of claim 21, wherein the device is devoid of an electrical conductor that extends through opposing surfaces of the second housing portion.

30. The device of claim 21, wherein the device is devoid of wire bonds, TAB leads and solder joints.

31. An optoelectronic semiconductor package device, comprising:

a semiconductor chip that includes an upper surface, a lower surface and four outer side surfaces between the upper and lower surfaces, wherein the upper surface includes a light sensitive cell and a conductive pad;

an insulative housing that includes a top surface, a bottom surface and peripheral side surfaces between the top and bottom surfaces, wherein the insulative housing further includes first and second insulative housing portions, the first housing portion is a single-piece that provides the bottom surface, the peripheral side surfaces and a peripheral portion of the top surface, contacts the lower surface and the outer side surfaces, is spaced from the light sensitive cell and is non-transparent, and the second housing portion is a single-piece or double-piece that provides a central portion of the top surface within the peripheral portion of the top surface, contacts the first housing portion, the light sensitive cell and the conductive trace, is spaced from the lower surface, is farther from the bottom surface than the lower surface is from the bottom surface, is transparent and is exposed; and a conductive trace that extends outside the insulative housing and is electrically connected to the pad inside the insulative housing.

32. The device of claim 31, wherein the second housing portion includes first and second opposing surfaces, the first surface faces towards the chip and contacts the light sensitive cell and is spaced from the conductive trace, and the second surface faces away from the chip and provides the central portion of the top surface and is exposed.

33. The device of claim 31, wherein the peripheral portion of the top surface forms a rectangular peripheral ledge, and the second housing portion is located within and recessed relative to the peripheral ledge.

34. The device of claim 33, wherein the peripheral ledge includes four inner side surfaces that are opposite the peripheral side surfaces and outside a periphery of the chip.

35. The device of claim 31, wherein the first housing portion is a transfer molded material, and the second housing portion is a cured polymeric material.

36. The device of claim 31, wherein the insulative housing consists of the first and second housing portions.

37. The device of claim 31, wherein the first housing portion is a transfer molded material that includes a peripheral ledge, and the second housing portion is a cured polymeric material that is located within the peripheral ledge and includes a first surface that faces towards the chip and contacts the light sensitive cell and is spaced from the conductive trace and a second surface opposite the first surface that faces away from the chip and provides the central portion of the top surface and is exposed.

38. The device of claim 31, wherein the device is devoid of an electrical conductor that extends through the top or bottom surfaces.

39. The device of claim 31, wherein the device is devoid of an electrical conductor that extends through opposing surfaces of the second housing portion.

40. The device of claim 31, wherein the device is devoid of wire bonds, TAB leads and solder joints.

41. An optoelectronic semiconductor package device, comprising:

a semiconductor chip that includes an upper surface and a lower surface, wherein the upper surface includes a light sensitive cell and a conductive pad;

an insulative housing that includes a top surface, a bottom surface and a peripheral side surface between the top and bottom surfaces, wherein the insulative housing further includes a first insulative housing portion that covers the lower surface and is non-transparent and a second insulative housing portion that covers the light sensitive cell and is transparent; and a conductive trace that protrudes laterally from and extends through the side surface and is electrically connected to the pad, wherein the conductive trace includes a recessed portion that extends into the insulative housing and is spaced from the top and bottom surfaces and a non-recessed portion that extends outside the insulative housing and is adjacent to the recessed portion and the top surface.

42. The device of claim 41, wherein the first housing portion contacts the lower surface and four outer side surfaces of the chip.

43. The device of claim 41, wherein the second housing portion contacts the light sensitive cell and the conductive trace.

44. The device of claim 41, wherein the first housing portion includes a peripheral ledge, and the second housing portion is located within the peripheral ledge.

45. The device of claim 41, wherein the first housing portion is a transfer molded material, and the second housing portion is a cured polymeric material.

46. The device of claim 41, wherein the insulative housing consists of the first and second housing portions.

47. The device of claim 41, wherein the light sensitive cell contacts a major surface of the second housing portion that faces towards and is parallel to the upper surface.

48. The device of claim 41, wherein the device is devoid of an electrical conductor that extends through the top or bottom surfaces.

49. The device of claim 41, wherein the device is devoid of an electrical conductor that extends through opposing surfaces of the second housing portion.

50. The device of claim 41, wherein the device is devoid of wire bonds, TAB leads and solder joints.

51. An optoelectronic semiconductor package device, comprising:
a semiconductor chip that includes an upper surface and a lower surface, wherein the upper surface includes a light sensitive cell and a conductive pad;
an insulative housing that includes a top surface, a bottom surface and a peripheral side surface between the top and bottom surfaces, wherein the insulative housing further includes a first single-piece housing portion that contacts the lower surface and is spaced from the light sensitive cell and a second single-piece housing portion that contacts the first housing portion and the conductive trace and is transparent, the first housing portion alone provides the bottom surface, and the first and second housing portions in combination provide the top surface; and
a conductive trace that protrudes laterally from and extends through the side surface and is electrically connected to the pad, wherein the conductive trace includes a recessed portion that extends into the insulative housing and is spaced from the top and bottom surfaces and a non-recessed portion that extends outside the insulative housing and is adjacent to the recessed portion and contacts the insulative housing, wherein the recessed and non-recessed portions each include four outer surfaces, three of the outer surfaces of the recessed and non-recessed portions that do not face in the same direction as the top surface are coplanar with one another where the recessed and non-recessed portions are adjacent to one another, and one of the outer surfaces of the recessed and non-recessed portions that face in the same direction as the top surface are not coplanar with one another where the recessed and non-recessed portions are adjacent to one another.

52. The device of claim 51, wherein the second housing portion includes first and second opposing surfaces, the first surface contacts the light sensitive cell and is spaced from the conductive trace, and the second surface faces away from the chip and is exposed.

53. The device of claim 51, wherein the first housing portion includes a peripheral ledge, and the second housing portion is located within and recessed relative to the peripheral ledge.

54. The device of claim 53, wherein the peripheral ledge includes four inner side surfaces that are opposite the peripheral side surfaces and outside a periphery of the chip.

55. The device of claim 51, wherein the first housing portion is a transfer molded material, and the second housing portion is a cured polymeric material.

56. The device of claim 51, wherein the insulative housing consists of the first and second housing portions.

57. The device of claim 51, wherein the first housing portion is a transfer molded material that includes a peripheral ledge, and the second housing portion is a polymeric material that is located within the peripheral ledge and includes a first surface that contacts the light sensitive cell and is spaced from the conductive trace and a second surface opposite the first surface that faces away from the chip and is exposed.

58. The device of claim 51, wherein the device is devoid of an electrical conductor that extends through the top or bottom surfaces.

59. The device of claim 51, wherein the device is devoid of an electrical conductor that extends through opposing surfaces of the second housing portion.

60. The device of claim 51, wherein the device is devoid of wire bonds, TAB leads and solder joints.

61. An optoelectronic semiconductor package device, comprising:
a semiconductor chip that includes an upper surface, a lower surface and outer side surfaces between the upper and lower surfaces, wherein the upper surface includes a light sensitive cell and a conductive pad;
an insulative housing that includes a first single-piece non-transparent insulative housing portion that contacts the chip, covers the lower surface and the side surfaces and is spaced from the light sensitive cell and a second transparent insulative housing portion that contacts the first housing portion and the light sensitive cell, is spaced from the lower surface and is exposed; and
a conductive trace that extends laterally through an opening in the first housing portion, extends outside the insulative housing and is electrically connected to the pad inside the insulative housing, wherein the first housing portion spans 360 degrees around the conductive trace at the opening.

62. The device of claim 61, wherein the first housing portion contacts the lower surface and the side surfaces.

63. The device of claim 61, wherein the first housing portion includes a peripheral ledge, and the second housing portion is located within and recessed relative to the peripheral ledge.

64. The device of claim 61, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the opening includes sidewalls that contact and span 360 degrees around the recessed portion.

65. The device of claim 61, wherein the device is devoid of wire bonds, TAB leads and solder joints.

66. An optoelectronic semiconductor package device, comprising:
a semiconductor chip that includes an upper surface, a lower surface and outer side surfaces between the upper and lower surfaces, wherein the upper surface includes a light sensitive cell and a conductive pad;
an insulative housing that includes a first single-piece non-transparent insulative housing portion that contacts the chip, covers the lower surface and the side surfaces and is spaced from the light sensitive cell and a second transparent insulative housing portion that contacts the first housing portion and the light sensitive cell, is spaced from the lower surface and is exposed; and
a conductive trace that extends through an opening in the first housing portion, extends outside the insulative housing, is bent outside the insulative housing and is electrically connected to the pad inside the insulative housing.

67. The device of claim 66, wherein the first housing portion contacts the lower surface and the side surfaces.

68. The device of claim 66, wherein the first housing portion includes a peripheral ledge, and the second housing portion is located within and recessed relative to the peripheral ledge.

69. The device of claim 66, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the opening includes sidewalls that contact and span 360 degrees around the recessed portion.

70. The device of claim 66, wherein the device is devoid of wire bonds, TAB leads and solder joints.

71. An optoelectronic semiconductor package device, comprising:
a semiconductor chip that includes an upper surface, a lower surface and outer side surfaces between the upper and lower surfaces, wherein the upper surface includes a light sensitive cell and a conductive pad;
an insulative housing that includes a first single-piece non-transparent insulative housing portion that contacts the chip, covers the lower surface and the side surfaces and is spaced from the light sensitive cell and a second transparent insulative housing portion that contacts the first housing portion and the light sensitive cell, is spaced from the lower surface and is exposed; and
a conductive trace that extends through an opening in the first housing portion, extends outside the insulative housing, does not contact an insulative material outside the first housing portion and is electrically connected to the pad inside the insulative housing.

72. The device of claim 71, wherein the first housing portion contacts the lower surface and the side surfaces.

73. The device of claim 71, wherein the first housing portion includes a peripheral ledge, and the second housing portion is located within and recessed relative to the peripheral ledge.

74. The device of claim 71, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the opening includes sidewalls that contact and span 360 degrees around the recessed portion.

75. The device of claim 71, wherein the device is devoid of wire bonds, TAB leads and solder joints.

76. An optoelectronic semiconductor package device, comprising:
a semiconductor chip that includes an upper surface, a lower surface and outer side surfaces between the upper and lower surfaces, wherein the upper surface includes a light sensitive cell and a conductive pad;
an insulative housing that includes a first single-piece non-transparent insulative housing portion that covers the lower surface and the side surfaces and is spaced from the light sensitive cell and a second transparent insulative housing portion that contacts the first housing portion and the light sensitive cell, is spaced from the lower surface and is exposed; and
a conductive trace that includes a lead and a planar metal trace, wherein the lead extends through an opening in the first housing portion, extends outside the insulative housing, does not extend across any edge of the pad and is electrically connected to the pad inside the insulative housing, and the planar metal trace contacts and is not integral with the lead, contacts the first housing portion, extends across one of the side surfaces and does not extend outside the insulative housing.

77. The device of claim 76, wherein the first housing portion contacts the lower surface and the side surfaces.

78. The device of claim 76, wherein the first housing portion includes a peripheral ledge, and the second housing portion is located within and recessed relative to the peripheral ledge.

79. The device of claim 76, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the opening includes sidewalls that contact and span 360 degrees around the recessed portion.

80. The device of claim 76, wherein the device is devoid of wire bonds, TAB leads and solder joints.

81. An optoelectronic semiconductor package device, comprising:
a semiconductor chip that includes an upper surface, a lower surface and outer side surfaces between the upper and lower surfaces, wherein the upper surface includes a light sensitive cell and a conductive pad;
an insulative housing that includes a first single-piece non-transparent insulative housing portion that covers the lower surface and the side surfaces and is spaced from the light sensitive cell and a second transparent insulative housing portion that contacts the first housing portion and the light sensitive cell, is spaced from the lower surface and is exposed; and
a conductive trace that includes a lead and a planar metal trace, wherein the lead extends through an opening in the first housing portion, extends outside the insulative housing and is electrically connected to the pad inside the insulative housing, and the planar metal trace contacts and is not integral with the lead, contacts the first and second housing portions, extends across one of the side surfaces and does not extend outside the insulative housing.

82. The device of claim 81, wherein the first housing portion contacts the lower surface and the side surfaces.

83. The device of claim 81, wherein the first housing portion includes a peripheral ledge, and the second housing portion is located within and recessed relative to the peripheral ledge.

84. The device of claim 81, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the opening includes sidewalls that contact and span 360 degrees around the recessed portion.

85. The device of claim 81, wherein the device is devoid of wire bonds, TAB leads and solder joints.

86. An optoelectronic semiconductor package device, comprising:
- a semiconductor chip that includes an upper surface, a lower surface and outer side surfaces between the upper and lower surfaces, wherein the upper surface includes a light sensitive cell and a conductive pad;
- an insulative housing that includes a first single-piece non-transparent insulative housing portion that covers the lower surface and the side surfaces and is spaced from the light sensitive cell and a second transparent insulative housing portion that contacts the first housing portion and the light sensitive cell, is spaced from the lower surface and is exposed; and
- a conductive trace that includes a lead and a planar metal trace, wherein the lead extends through an opening in the first housing portion, extends outside the insulative housing and is electrically connected to the pad inside the insulative housing, and the planar metal trace contacts and is not integral with the lead, contacts the first and second housing portions, overlaps the pad, extends across one of the side surfaces and does not extend outside the insulative housing.

87. The device of claim 86, wherein the first housing portion contacts the lower surface and the side surfaces.

88. The device of claim 86, wherein the first housing portion includes a peripheral ledge, and the second housing portion is located within and recessed relative to the peripheral ledge.

89. The device of claim 86, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the opening includes sidewalls that contact and span 360 degrees around the recessed portion.

90. The device of claim 86, wherein the device is devoid of wire bonds, TAB leads and solder joints.

91. An optoelectronic semiconductor package device, comprising:
- a semiconductor chip that includes an upper surface, a lower surface and four outer side surfaces between the upper and lower surfaces, wherein the upper surface includes a light sensitive cell and a conductive pad;
- an insulative housing that includes a top surface, a bottom surface and peripheral side surfaces between the top and bottom surfaces, wherein the insulative housing further includes first and second insulative housing portions, the first housing portion is a single-piece that contacts the chip, covers the lower surface and the outer side surfaces and provides the bottom surface, the peripheral side surfaces and a peripheral portion of the top surface and is non-transparent, the second housing portion contacts the first housing portion and the light sensitive cell, provides a central portion of the top surface within the peripheral portion of the top surface and is transparent, and the top surface is exposed; and
- a conductive trace that extends outside the insulative housing and is electrically connected to the pad inside the insulative housing.

92. The device of claim 91, wherein the first housing portion contacts the lower surface and the outer side surfaces.

93. The device of claim 91, wherein the conductive trace extends through an opening in one of the peripheral side surfaces.

94. The device of claim 91, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

95. The device of claim 91, wherein the device is devoid of wire bonds, TAB leads and solder joints.

96. An optoelectronic semiconductor package device, comprising:
- a semiconductor chip that includes an upper surface, a lower surface and four outer side surfaces between the upper and lower surfaces, wherein the upper surface includes a light sensitive cell and a conductive pad;
- an insulative housing that includes a top surface, a bottom surface and peripheral side surfaces between the top and bottom surfaces, wherein the insulative housing further includes first and second insulative housing portions, the first housing portion is a single-piece that contacts the chip, covers the lower surface and the outer side surfaces and provides the bottom surface, the peripheral side surfaces and a peripheral portion of the top surface and is non-transparent, the second housing portion contacts the first housing portion and the light sensitive cell, provides a central portion of the top surface within the peripheral portion of the top surface and is transparent, the first housing portion is exposed at the top surface, bottom surface and peripheral side surfaces, and the second housing portion is exposed at the top surface; and
- a conductive trace that extends outside the insulative housing and is electrically connected to the pad inside the insulative housing.

97. The device of claim 96, wherein the first housing portion contacts the lower surface and the outer side surfaces.

98. The device of claim 96, wherein the conductive trace extends through an opening in one of the peripheral side surfaces.

99. The device of claim 96, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

100. The device of claim 96, wherein the device is devoid of wire bonds, TAB leads and solder joints.

101. An optoelectronic semiconductor package device, comprising:

- a semiconductor chip that includes an upper surface, a lower surface and four outer side surfaces between the upper and lower surfaces, wherein the upper surface includes a light sensitive cell and a conductive pad;
- an insulative housing that includes a top surface, a bottom surface and peripheral side surfaces between the top and bottom surfaces, wherein the insulative housing further includes first and second insulative housing portions, the first housing portion is a single-piece that contacts the chip, covers the lower surface and the outer side surfaces and provides the bottom surface, the peripheral side surfaces and a peripheral portion of the top surface and is non-transparent, the second housing portion contacts the first housing portion and the light sensitive cell, provides a central portion of the top surface within the peripheral portion of the top surface and is transparent, the central portion of the top surface is recessed relative to the peripheral portion of the top surface, and the top surface is exposed; and
- a conductive trace that extends outside the insulative housing and is electrically connected to the pad inside the insulative housing.

102. The device of claim 101, wherein the first housing portion contacts the lower surface and the outer side surfaces.

103. The device of claim 101, wherein the conductive trace extends through an opening in one of the peripheral side surfaces.

104. The device of claim 101, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

105. The device of claim 101, wherein the device is devoid of wire bonds, TAB leads and solder joints.

106. An optoelectronic semiconductor package device, comprising:

- a semiconductor chip that includes an upper surface, a lower surface and four outer side surfaces between the upper and lower surfaces, wherein the upper surface includes a light sensitive cell and a conductive pad;
- an insulative housing that includes a top surface, a bottom surface and peripheral side surfaces between the top and bottom surfaces, wherein the insulative housing further includes first and second insulative housing portions, the first housing portion is a single-piece that contacts the chip, covers the lower surface and the outer side surfaces and provides the bottom surface, the peripheral side surfaces and a peripheral portion of the top surface and is non-transparent, the second housing portion contacts the first housing portion and the light sensitive cell, provides a central portion of the top surface within the peripheral portion of the top surface and is transparent, the central portion of the top surface is recessed relative to the peripheral portion of the top surface, the first housing portion is exposed at the top surface, bottom surface and peripheral side surfaces, and the second housing portion is exposed at the top surface; and
- a conductive trace that extends outside the insulative housing and is electrically connected to the pad inside the insulative housing.

107. The device of claim 106, wherein the first housing portion contacts the lower surface and the outer side surfaces.

108. The device of claim 106, wherein the conductive trace extends through an opening in one of the peripheral side surfaces.

109. The device of claim 106, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

110. The device of claim 106, wherein the device is devoid of wire bonds, TAB leads and solder joints.

111. An optoelectronic semiconductor package device, comprising:

- a semiconductor chip that includes an upper surface, a lower surface and four outer side surfaces between the upper and lower surfaces, wherein the upper surface includes a light sensitive cell and a conductive pad;
- an insulative housing that includes a top surface, a bottom surface and peripheral side surfaces between the top and bottom surfaces, wherein the insulative housing further includes first and second insulative housing portions, the first housing portion is a single-piece that contacts the chip, covers the lower surface and the outer side surfaces and provides the bottom surface, the peripheral side surfaces and a peripheral portion of the top surface and is non-transparent, the second housing portion contacts the first housing portion and the light sensitive cell, provides a central portion of the top surface within the peripheral portion of the top surface and is transparent, and the top, bottom and peripheral side surfaces are exposed; and
- a conductive trace that extends outside the insulative housing, is located between the second housing portion and the chip inside the insulative housing, is spaced from the top surface and is electrically connected to the pad inside the insulative housing.

112. The device of claim 111, wherein the first housing portion contacts the lower surface and the outer side surfaces.

113. The device of claim 111, wherein the conductive trace extends through an opening in one of the peripheral side surfaces.

114. The device of claim 111, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

115. The device of claim 111, wherein the device is devoid of wire bonds, TAB leads and solder joints.

116. An optoelectronic semiconductor package device, comprising:

a semiconductor chip that includes an upper surface, a lower surface and four outer side surfaces between the upper and lower surfaces, wherein the upper surface includes a light sensitive cell and a conductive pad;

an insulative housing that includes a top surface, a bottom surface and peripheral side surfaces between the top and bottom surfaces, wherein the insulative housing further includes first and second insulative housing portions, the first housing portion is a single-piece that contacts the chip, covers the lower surface and the outer side surfaces and provides the bottom surface, the peripheral side surfaces and a peripheral portion of the top surface and is non-transparent, the second housing portion contacts the first housing portion and the light sensitive cell, provides a central portion of the top surface within the peripheral portion of the top surface and is transparent, and the top, bottom and peripheral side surfaces are exposed; and a conductive trace that extends outside the insulative housing, includes a top surface that faces away from the chip and contacts the second housing portion inside the insulative housing, includes a bottom surface that faces towards the chip and contacts the second housing portion inside the insulative housing, is spaced from the top and bottom surfaces, extends through one of the peripheral side surfaces and is electrically connected to the pad inside the insulative housing.

117. The device of claim 116, wherein the first housing portion contacts the lower surface and the outer side surfaces.

118. The device of claim 116, wherein the conductive trace extends through an opening in one of the peripheral side surfaces.

119. The device of claim 116, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

120. The device of claim 116, wherein the device is devoid of wire bonds, TAB leads and solder joints.

121. An optoelectronic semiconductor package device, comprising:

a semiconductor chip that includes an upper surface, a lower surface and four outer side surfaces between the upper and lower surfaces, wherein the upper surface includes a light sensitive cell and a conductive pad;

an insulative housing that includes first and second insulative housing portions, wherein the first housing portion is a single-piece that covers the lower surface and the outer side surfaces and includes a top surface, a bottom surface, peripheral side surfaces between the top and bottom surfaces, a peripheral ledge at the top surface, and inner side surfaces inside the peripheral ledge opposite the peripheral side surfaces that extend from the top surface towards the bottom surface and are spaced from the bottom surface and is non-transparent, and the second housing portion is located within and recessed relative to the peripheral ledge, contacts the light sensitive cell, does not extend midway between the upper and lower surfaces outside the chip and is transparent; and a conductive trace that extends outside the insulative housing and is electrically connected to the pad inside the insulative housing.

122. The device of claim 121, wherein the first housing portion contacts the lower surface and the outer side surfaces.

123. The device of claim 121, wherein the conductive trace extends through an opening in one of the peripheral side surfaces.

124. The device of claim 121, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

125. The device of claim 121, wherein the device is devoid of wire bonds, TAB leads and solder joints.

126. An optoelectronic semiconductor package device, comprising:

a semiconductor chip that includes an upper surface, a lower surface and four outer side surfaces between the upper and lower surfaces, wherein the upper surface includes a light sensitive cell and a conductive pad;

an insulative housing that includes first and second insulative housing portions, wherein the first housing portion is a single-piece that includes a top surface, a bottom surface, peripheral side surfaces between the top and bottom surfaces, a peripheral ledge at the top surface, and inner side surfaces inside the peripheral ledge opposite the peripheral side surfaces that extend from the top surface towards the bottom surface and are spaced from the bottom surface and is non-transparent, the second housing portion is located within and recessed relative to the peripheral ledge, contacts the light sensitive cell, does not extend midway between the upper and lower surfaces outside the chip and is transparent, the first housing portion is exposed at the top surface, bottom surface and peripheral side surfaces, and the second housing portion is exposed at the top surface; and a conductive trace that extends outside the insulative housing and is electrically connected to the pad inside the insulative housing.

127. The device of claim 126, wherein the first housing portion contacts the lower surface and the outer side surfaces.

128. The device of claim 126, wherein the conductive trace extends through an opening in one of the peripheral side surfaces.

129. The device of claim 126, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

130. The device of claim 126, wherein the device is devoid of wire bonds, TAB leads and solder joints.

131. An optoelectronic semiconductor package device, comprising:

a semiconductor chip that includes an upper surface, a lower surface and four outer side surfaces between the upper and lower surfaces, wherein the upper surface includes a light sensitive cell and a conductive pad;

an insulative housing that includes first and second insulative housing portions, wherein the first housing portion is a single-piece that covers the lower surface and the outer side surfaces and includes a top surface, a bottom surface, peripheral side surfaces between the top and bottom surfaces, a peripheral ledge at the top surface, and inner side surfaces inside the peripheral ledge opposite the peripheral side surfaces that extend from the top surface towards the bottom surface and are spaced from the bottom surface and is non-transparent, and the second housing portion is located within and recessed relative to the peripheral ledge, contacts the light sensitive cell and the inner side surfaces, does not extend midway between the upper and lower surfaces outside the chip and is transparent; and a conductive trace that extends outside the insulative housing and is electrically connected to the pad inside the insulative housing.

132. The device of claim 131, wherein the first housing portion contacts the lower surface and the outer side surfaces.

133. The device of claim 131, wherein the conductive trace extends through an opening in one of the peripheral side surfaces.

134. The device of claim 131, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

135. The device of claim 131, wherein the device is devoid of wire bonds, TAB leads and solder joints.

136. An optoelectronic semiconductor package device, comprising:

a semiconductor chip that includes an upper surface, a lower surface and four outer side surfaces between the upper and lower surfaces, wherein the upper surface includes a light sensitive cell and a conductive pad;

an insulative housing that includes first and second insulative housing portions, wherein the first housing portion is a single-piece that covers the lower surface and the outer side surfaces and includes a top surface, a bottom surface, peripheral side surfaces between the top and bottom surfaces, a peripheral ledge at the top surface, and inner side surfaces inside the peripheral ledge opposite the peripheral side surfaces that extend from the top surface towards the bottom surface and are spaced from the bottom surface and is non-transparent, the second housing portion is located within and recessed relative to the peripheral ledge, contacts the light sensitive cell and the inner side surfaces, does not extend midway between the upper and lower surfaces outside the chip and is transparent, the first housing portion is exposed at the top surface, bottom surface and peripheral side surfaces, and the second housing portion is exposed at the top surface; and a conductive trace that extends outside the insulative housing and is electrically connected to the pad inside the insulative housing.

137. The device of claim 136, wherein the first housing portion contacts the lower surface and the outer side surfaces.

138. The device of claim 136, wherein the conductive trace extends through an opening in one of the peripheral side surfaces.

139. The device of claim 136, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

140. The device of claim 136, wherein the device is devoid of wire bonds, TAB leads and solder joints.

141. An optoelectronic semiconductor package device, comprising:

a semiconductor chip that includes an upper surface, a lower surface and four outer side surfaces between the upper and lower surfaces, wherein the upper surface includes a light sensitive cell and a conductive pad;

an insulative housing that includes first and second insulative housing portions, wherein the first housing portion is a single-piece that covers the lower surface and the outer side surfaces and includes a top surface, a bottom surface, peripheral side surfaces between the top and bottom surfaces, a peripheral ledge at the top surface, and inner side surfaces inside the peripheral ledge opposite the peripheral side surfaces that extend from the top surface towards the bottom surface and are spaced from the bottom surface and is non-transparent, and the second housing portion extends into the peripheral ledge, contacts the light sensitive cell, does not extend midway between the upper and lower surfaces outside the chip, does not extend across any of the peripheral side surfaces, is transparent and is exposed; and a conductive trace that extends outside the insulative housing and is electrically connected to the pad inside the insulative housing.

142. The device of claim 141, wherein the first housing portion contacts the lower surface and the outer side surfaces.

143. The device of claim 141, wherein the conductive trace extends through an opening in one of the peripheral side surfaces.

144. The device of claim 141, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

145. The device of claim 141, wherein the device is devoid of wire bonds, TAB leads and solder joints.

146. An optoelectronic semiconductor package device, comprising:
  a semiconductor chip that includes an upper surface, a lower surface and four outer side surfaces between the upper and lower surfaces, wherein the upper surface includes a light sensitive cell and a conductive pad;
  an insulative housing that includes first and second insulative housing portions, wherein the first housing portion is a single-piece that covers the lower surface and the outer side surfaces and includes a top surface, a bottom surface, uncurved peripheral side surfaces between the top and bottom surfaces, a peripheral ledge at the top surface, and inner side surfaces inside the peripheral ledge opposite the peripheral side surfaces that extend from the top surface towards the bottom surface and are spaced from the bottom surface and is non-transparent, the second housing portion extends into the peripheral ledge, contacts the light sensitive cell, does not extend midway between the upper and lower surfaces outside the chip and is transparent, the first housing portion is exposed at the top surface, bottom surface and peripheral side surfaces, and the second housing portion is exposed at the top surface; and
  a conductive trace that extends outside the insulative housing and is electrically connected to the pad inside the insulative housing.

147. The device of claim 146, wherein the first housing portion contacts the lower surface and the outer side surfaces.

148. The device of claim 146, wherein the conductive trace extends through an opening in one of the peripheral side surfaces.

149. The device of claim 146, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

150. The device of claim 146, wherein the device is devoid of wire bonds, TAB leads and solder joints.

151. An optoelectronic semiconductor package device, comprising:
  a semiconductor chip that includes an upper surface, a lower surface and outer side surfaces between the upper and lower surfaces, wherein the upper surface includes a light sensitive cell and a conductive pad;
  an insulative housing that includes a first single-piece non-transparent insulative housing portion that contacts the lower surface and the side surfaces and is spaced from the upper surface and a second transparent insulative housing portion that contacts the first housing portion and the light sensitive cell, is spaced from the lower surface and is recessed relative to the peripheral ledge; and
  a conductive trace that extends through an opening in the first housing portion, extends outside the insulative housing and is electrically connected to the pad inside the insulative housing.

152. An optoelectronic semiconductor package device, comprising:
  a semiconductor chip that includes an upper surface, a lower surface and outer side surfaces between the upper and lower surfaces, wherein the upper surface includes a light sensitive cell and a conductive pad;
  an insulative housing that includes a first single-piece non-transparent insulative housing portion that contacts the chip, covers the lower surface and the side surfaces and is spaced from the light sensitive cell and a second transparent insulative housing portion that contacts the first housing portion and the light sensitive cell, is spaced from the lower surface and is exposed; and
  a conductive trace that extends through an opening in the first housing portion, extends outside the insulative housing and is electrically connected to the pad inside the insulative housing, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the opening includes sidewalls that contact and span 360 degrees around the recessed portion.

153. An optoelectronic semiconductor package device, comprising:
  a semiconductor chip that includes an upper surface, a lower surface and outer side surfaces between the upper and lower surfaces, wherein the upper surface includes a light sensitive cell and a conductive pad;

an insulative housing that includes a first single-piece non-transparent insulative housing portion that covers the lower surface and the side surfaces and is spaced from the light sensitive cell and a second transparent insulative housing portion that contacts the first housing portion and the light sensitive cell, is spaced from the lower surface and is exposed; and a conductive trace that includes a lead and a planar metal trace, wherein the lead extends through an opening in the first housing portion, extends outside the insulative housing and is electrically connected to the pad inside the insulative housing, the planar metal trace contacts and is not integral with the lead, extends across one of the side surfaces and does not extend outside the insulative housing, and the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the opening includes sidewalls that contact and span 360 degrees around the recessed portion.

154. An optoelectronic semiconductor package device, comprising:

a semiconductor chip that includes an upper surface, a lower surface and four outer side surfaces between the upper and lower surfaces, wherein the upper surface includes a light sensitive cell and a conductive pad;

an insulative housing that includes first and second insulative housing portions, wherein the first housing portion is a single-piece that covers the lower surface and the outer side surfaces and includes a top surface, a bottom surface, uncurved peripheral side surfaces between the top and bottom surfaces, a peripheral ledge at the top surface, and inner side surfaces inside the peripheral ledge opposite the peripheral side surfaces that extend from the top surface towards the bottom surface and are spaced from the bottom surface and is non-transparent, and the second housing portion extends into the peripheral ledge, contacts the light sensitive cell, does not extend midway between the upper and lower surfaces outside the chip and is transparent; and a conductive trace that extends outside the insulative housing and is electrically connected to the pad inside the insulative housing, wherein the conductive trace includes a recessed portion and a non-recessed portion, the recessed portion extends into the insulative housing, the non-recessed portion extends outside the insulative housing, surfaces of the recessed and non-recessed portions that face in the same direction as the lower surface are coplanar with one another where the recessed and non-recessed portions are adjacent to one another, surfaces of the recessed and non-recessed portions that face in the same direction as the upper surface are not coplanar with one another where the recessed and non-recessed portions are adjacent to one another, and the first housing portion includes sidewalls that contact and span 360 degrees around the recessed portion.

\* \* \* \* \*